United States Patent [19]
Ohno

[11] Patent Number: 5,956,586
[45] Date of Patent: Sep. 21, 1999

[54] SEMICONDUCTOR MEMORY DEVICE AND METHOD OF MANUFACTURING THE SAME

[75] Inventor: Yoshikazu Ohno, Hyogo, Japan

[73] Assignee: Mitsubishi Denki Kabushiki Kaisha, Tokyo, Japan

[21] Appl. No.: 08/758,503

[22] Filed: Dec. 2, 1996

Related U.S. Application Data

[62] Division of application No. 08/457,341, Jun. 1, 1995, Pat. No. 5,608,248.

[30] Foreign Application Priority Data

Aug. 30, 1994 [JP] Japan .................................. 6-204919

[51] Int. Cl.$^6$ .............................................. H01L 21/8242
[52] U.S. Cl. ........................................ 438/239; 438/253
[58] Field of Search ...................... 438/238, 239, 438/253, 254, 396, 397

[56] References Cited

U.S. PATENT DOCUMENTS

| | | | |
|---|---|---|---|
| 4,561,170 | 12/1985 | Doering | 438/281 |
| 5,218,217 | 6/1993 | Oda et al. | 257/296 |
| 5,486,712 | 1/1996 | Arima | 257/296 |
| 5,736,421 | 4/1998 | Shimomura et al. | 437/52 |
| 5,753,550 | 5/1998 | Murata et al. | 438/253 |
| 5,780,351 | 7/1998 | Arita et al. | 438/396 |

FOREIGN PATENT DOCUMENTS

| | | |
|---|---|---|
| 4-215473 | 8/1992 | Japan . |
| 4-225276 | 8/1992 | Japan . |

*Primary Examiner*—Joni Chang
*Attorney, Agent, or Firm*—McDermott, Will & Emery

[57] ABSTRACT

A first interlayer insulating layer is formed on a main surface of a substrate. A semiconductor layer is formed on the first interlayer insulating layer. A gate electrode (word line) of a switch MOS transistor is formed under the semiconductor layer. A bit line and a capacitor are formed on the semiconductor layer. The semiconductor layer has a substantially flat upper surface, and an interlayer insulating layer and a second interlayer insulating layer having substantially flat upper surfaces are formed on the semiconductor layer. A capacitor is formed on the second interlayer insulating layer, and the capacitor and the second interlayer insulating layer are covered with a third interlayer insulating layer. Thereby, a level difference between a memory cell array and a peripheral circuitry can be reduced in a semiconductor memory device.

7 Claims, 44 Drawing Sheets

SEMICONDUCTOR MEMORY DEVICE AND METHOD OF MANUFACTURING THE SAME

This application is a division of Application Ser. No. 08/457,341 filed Jun. 1, 1995 now U.S. Pat. No. 5,608,248.

BACKGROUND OF THE INVENTION

1. Field of the Invention

The present invention relates to a semiconductor memory device and a method of manufacturing the same, and in particular to a semiconductor memory device having a switch MOS transistor, i.e., MOS transistor for a switch and a charge accumulating capacitor as well as a method of manufacturing the same.

2. Description of the Background Art

A DRAM (Dynamic Random Access Memory) is known as an example of a semiconductor memory device having a switch MOS transistor and a charge accumulating capacitor. In accordance with high integration of DRAMs in recent years, such a DRAM has been developed that has a capacitor of a stacked structure, i.e., a so-called stacked type capacitor for accumulating charges.

FIG. 43 is a cross section showing a DRAM having a stacked type capacitor in the prior art. Referring to FIG. 43, the DRAM includes a memory cell array provided with memory cells which include switch MOS transistors and charge accumulating capacitors, and a peripheral circuitry provided with peripheral circuits for controlling operation of the memory cells.

A p-type silicon substrate 1 is selectively provided at its main surface with element isolating oxide films 2. The memory cell array is provided with switch transistor pairs 5, only one of which is shown in FIG. 43. Switch MOS transistor pair 5 includes n-type impurity diffusion regions 6a, 6b and 6c, which are formed at the main surface of silicon substrate 1 and are spaced from each other to define channel regions, as well as gate electrodes 4 formed on the channel regions with gate oxide films 3 therebetween.

Each gate electrode 4 is covered with an oxide film 7. Over element isolating oxide films 2, there are extended word lines 4 connected to gate electrodes of another switch MOS transistors. In the peripheral circuitry, an n-type impurity diffusion region 6d is formed at the main surface of p-type silicon substrate 1.

Gate electrodes 4 and oxide films 7 are covered with a first interlayer insulating layer 8 which is made of, e.g., a silicon oxide film and is formed on the main surface of p-type silicon substrate 1. Interlayer insulating layer 8 has a thickness not less than about 3000 First interlayer insulating layer 8 is provided with a contact hole 9 reaching n-type impurity diffusion layer 6b. A bit line 10 is formed in contact hole 9. In this case, bit line 10 has a polycide structure including a polycrystalline silicon layer and a silicide layer formed on this polycrystalline silicon layer.

Bit line 10 and first interlayer insulating layer 8 are covered with a second interlayer insulating layer 11 formed of, e.g., a silicon oxide film. There are also formed contact holes 25 which penetrate second and first interlayer insulating layers 11 and 8 and reach n-type impurity diffusion layers 6a or 6c.

A capacitor lower electrode 13 made of polycrystalline silicon is formed in each contact hole 25 and extends over second interlayer insulating layer 11. Capacitor lower electrode 13 is covered with a capacitor dielectric film 14 having a layered structure formed of a silicon nitride film and a silicon oxide film. Capacitor dielectric film 14 is covered with a capacitor upper electrode 15 made of, e.g., polycrystalline silicon. Capacitor lower electrode 13, capacitor dielectric film 14 and capacitor upper electrode 15 form a capacitor 12 for accumulating electric charges.

Capacitor 12 is covered with a third interlayer insulating layer 16 which is formed of, e.g., a silicon oxide film and extends from the memory cell array into the peripheral circuitry. In the memory cell array, there are formed gate electrodes 4 of switch transistors 5 and capacitor 12 as described above, so that the upper surface of third interlayer insulating layer 16 is located at a level higher than the upper surface of third interlayer insulating layer 16 in the peripheral circuitry. As a result, a stepped portion 20 is formed at and around a boundary between the peripheral circuitry and the memory cell array.

On third interlayer insulating layer 16, there are formed interconnection layers 17 made of material including aluminum or the like. As shown in FIG. 43, interconnection layer 17 may be formed on stepped portion 20. In this case, contact hole 18 which extends through first, second and third interlayer insulating layers 8, 11 and 16 to n-type impurity diffusion layer 6d is formed at the peripheral circuitry near the memory cell array, and a plug electrode 19 made of, e.g., tungsten is formed in contact hole 18. Plug electrode 19 electrically connects interconnection layer 17 formed on stepped portion 20 to n-type impurity diffusion layer 6d.

However, the conventional DRAM described above has the following problems, which will be described below with reference to FIGS. 43 and 44. FIG. 44 is a cross section showing, on an enlarged scale, the peripheral circuitry and the memory cell array in FIG. 43.

As shown in FIG. 43, the memory cell array is provided with capacitor 12, bit line 10 and gate electrode 4 of switch MOS transistor 5. Meanwhile, these are not formed in the peripheral circuitry. As a result, stepped portion 20 having a large level difference H is formed at the boundary between the memory cell array and the peripheral circuitry as shown in FIG. 44. This reduces a focus margin in an exposure process for patterning which will be performed for forming interconnection layers 17, when interconnection layer 17 is to be formed on the stepped portion 20. This presents difficulty in formation of interconnection layers 17. Further, the large level difference H is liable to cause failure in patterning of interconnection layers 17. Therefore, problems such as breakage of interconnection layer 17 and/or short-circuit between adjacent interconnection layers 17 are liable to occur.

Further, if contact hole 18 is formed at stepped portion 20 having the large level difference H as described above, contact hole 18 has a depth D considerably larger than that of other contact holes, i.e., contact holes formed inside the peripheral circuitry. This results in deviation of the depth of contact holes in the peripheral circuitry. This presents difficulty in formation of the contact holes in the peripheral circuitry. Further, due to the large depth D of contact hole 18, a void is liable to generate at plug electrode 19, which is formed in contact hole 18. This reduces reliability of the interconnection layers.

SUMMARY OF THE INVENTION

The invention has been developed to overcome the above-noted disadvantages, and it is an object of the invention to provide a semiconductor memory device which can reduce a level difference between a memory cell array and a peripheral circuitry as well as a method of manufacturing the same.

A semiconductor memory device according to an aspect of the invention includes a memory cell array provided with a memory cell having a switch MOS transistor and a charge storing capacitor, and a peripheral circuitry provided with a peripheral circuit for controlling operation of the memory cell. The semiconductor memory device of this aspect includes a substrate having a main surface, a first interlayer insulating layer, a semiconductor layer, first and second impurity diffusion layers, a gate electrode of a switch MOS transistor, a capacitor, a bit line, a second interlayer insulating layer and an interconnection layer. The first interlayer insulating layer is formed on the main surface of the substrate and extends from the memory cell array into the peripheral circuitry. The semiconductor layer is formed on the first interlayer insulating layer located in the memory cell array and the peripheral circuitry. First and second impurity diffusion layers are formed at the semiconductor layer located in the memory cell array and are spaced from each other to define a channel region of the switch MOS transistor. The gate electrode of the switch MOS transistor is formed under the semiconductor layer and is opposed to the channel region. The capacitor is formed on the semiconductor layer and is electrically connected to the first impurity diffusion layer. The bit line is formed on the semiconductor layer and is electrically connected to the second impurity diffusion layer. The second interlayer insulating layer covers the capacitor, the bit line and the semiconductor layer, and extends from the memory cell array into the peripheral circuitry. The interconnection layer is formed on the second interlayer insulating layer.

According to the semiconductor memory device of the above aspect of the invention, the gate electrode of the switch MOS transistor is formed under the semiconductor layer. Thereby, it is possible to eliminate a level difference between the memory cell array and the peripheral circuitry, which may be caused by the gate electrode of the switch MOS transistor. As a result, the level difference between the memory cell array and the peripheral circuitry can be substantially reduced to a value of the level difference caused by the thickness of the capacitor. Therefore, it is possible to reduce the level difference between the memory cell array and the peripheral circuitry as compared with the prior art.

A semiconductor memory device according to another aspect of the invention includes a memory cell array and a peripheral circuitry similarly to the above aspect. The semiconductor memory device of this aspect includes a substrate having a main surface, first, second, third and fourth interlayer insulating layers, a semiconductor layer, first and second impurity diffusion layers, a gate electrode of a switch MOS transistor, a capacitor, a bit line and an interconnection layer. The first interlayer insulating layer is formed on the main surface of the substrate and extends from the memory cell array into the peripheral circuitry. The semiconductor layer is formed on the first interlayer insulating layer located in the memory cell array and the peripheral circuitry. First and second impurity diffusion layers are formed in the semiconductor layer located in the memory cell array and are spaced from each other to define the channel region of the switch MOS transistor. The second interlayer insulating layer is formed on the semiconductor layer, has a first contact hole reaching a surface of the first impurity diffusion layer, extends from the memory cell array into the peripheral circuitry, and has a substantially flat upper surface. The bit line is formed in the first contact hole. The third interlayer insulating layer is formed on the second interlayer insulating layer to cover the bit line, has a second contact hole penetrating the second interlayer insulating layer located on the second impurity diffusion layer and reaching a surface of the second impurity diffusion layer, and extends from the memory cell array into the peripheral circuitry. The capacitor is formed of a capacitor lower electrode extending from the second contact hole to an area over an upper surface of the third interlayer insulating layer, a capacitor dielectric film covering a surface of the capacitor lower electrode, and a capacitor upper electrode covering a surface of the capacitor dielectric film. The fourth interlayer insulating layer covers the capacitor and the third interlayer insulating layer, and extends from the memory cell array into the peripheral circuitry. The interconnection layer is formed on the fourth interlayer insulating layer.

According to the semiconductor memory device of the above aspect of the invention, the second and third interlayer insulating layers have substantially flat upper surfaces in the memory cell array and the peripheral circuitry, and the capacitor is formed on the third interlayer insulating layer. Therefore, a level difference between the memory cell array and the peripheral circuitry can be reduced as compared with the prior art, similarly to the former aspect. The second interlayer insulating layer is required only to insulate and isolate the bit line and the semiconductor layer from each other, so that the thickness thereof can be small. Therefore, a depth of the first contact hole can be small. As a result, the first contact hole can be formed easily. Further, by reducing the thickness of the second interlayer insulating layer, a total thickness of the second, third and fourth interlayer insulating layers formed on the semiconductor layer can be smaller than that in the prior art. Therefore, it is possible to reduce the depth of the contact hole formed in the peripheral circuitry.

A semiconductor memory device of still another aspect of the invention includes a semiconductor layer having first and second surfaces opposed to each other, first and second impurity diffusion layers, a gate electrode, a charge storing capacitor, and a bit line. The first and second impurity diffusion layers formed at the semiconductor layer and are spaced from each other to define a channel region. The gate electrode is formed on the first surface with an insulating layer therebetween and is opposed to the channel region. The charge storing capacitor is formed on the second surface and is electrically connected to the first impurity diffusion layer. The bit line is formed on the second surface and is electrically connected to the second impurity diffusion layer.

According to the semiconductor memory device of the above aspect of the invention, the gate electrode of the switch MOS transistor is formed at the first surface side of the semiconductor layer, and the capacitor and bit line are formed at the second surface side of the semiconductor layer. Owing to the this structure of the memory cell, the gate electrode of the switch MOS transistor can be disposed under the semiconductor layer, and the capacitor and bit line can be disposed above the semiconductor layer. As a result, a level difference between the memory cell array and the peripheral circuitry can be reduced similarly to the former aspects.

According to a method of manufacturing a semiconductor memory device of the invention, an element isolating region is formed on a main surface of a first substrate having the main surface and a rear surface opposed to each other. A switch MOS transistor is formed on the main surface of the first substrate located in a memory cell array. A first interlayer insulating layer covering the switch MOS transistor and the element isolating region and extending from the memory cell array into a peripheral circuitry is formed on the main surface of the first substrate. An upper surface of the first interlayer insulating layer is flattened. The upper surface of the first interlayer insulating layer is joined to a second substrate. Processing is effected on a rear surface of the first substrate to reduce a thickness of the first substrate for forming a semiconductor layer in the memory cell array and the peripheral circuitry. A bit line and a charge storing capacitor are formed on a surface of the semiconductor layer located in the memory cell array. A second interlayer insulating layer covering the bit line, the capacitor and the semiconductor layer and extending from the memory cell array into the peripheral circuitry is formed on the second interlayer insulating layer.

According to the method of manufacturing the semiconductor memory device of the invention, as described above, the upper surface of the first interlayer insulating layer, which covers the switch MOS transistor formed on the main surface of the first substrate, is joined to the second substrate, and the processing is effected on the rear surface of the first substrate to reduce the thickness of the first substrate. Thereby, the semiconductor layer is formed. Therefore, it is possible to form the gate electrode of the switch MOS transistor between the semiconductor layer and the substrate. The capacitor and the bit line are formed on the surface of the semiconductor layer. As a result, the gate electrode of the switch MOS transistor can be disposed under the semiconductor layer, and the capacitor and the bit line can be disposed on the semiconductor layer. Thereby, a level difference between the memory cell array and the peripheral circuitry can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to FIGS. 1 to 42.

(First Embodiment)

Figure 1:
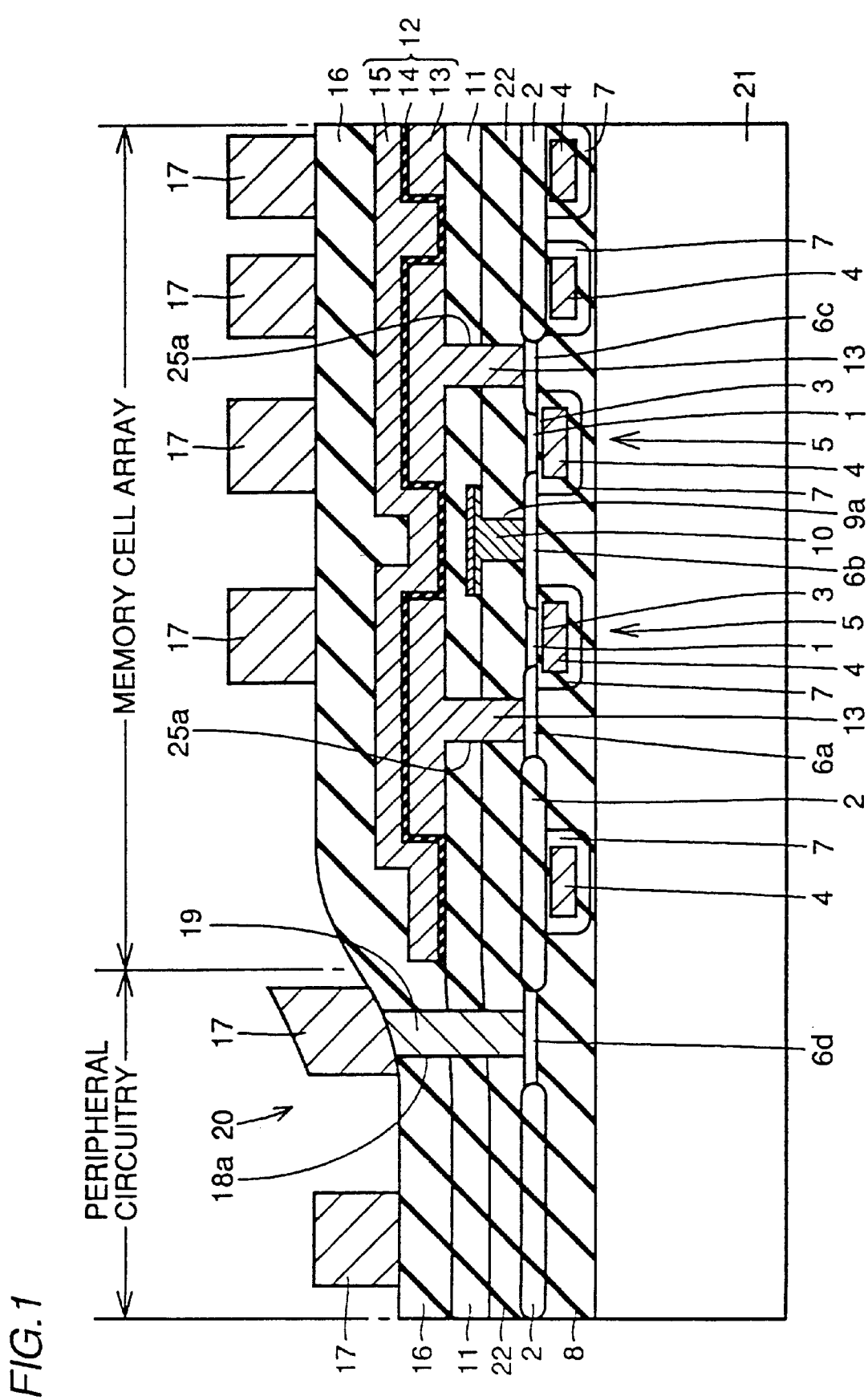
FIG. 1 is a cross section showing a DRAM of a first embodiment of the invention.
Figure 2:
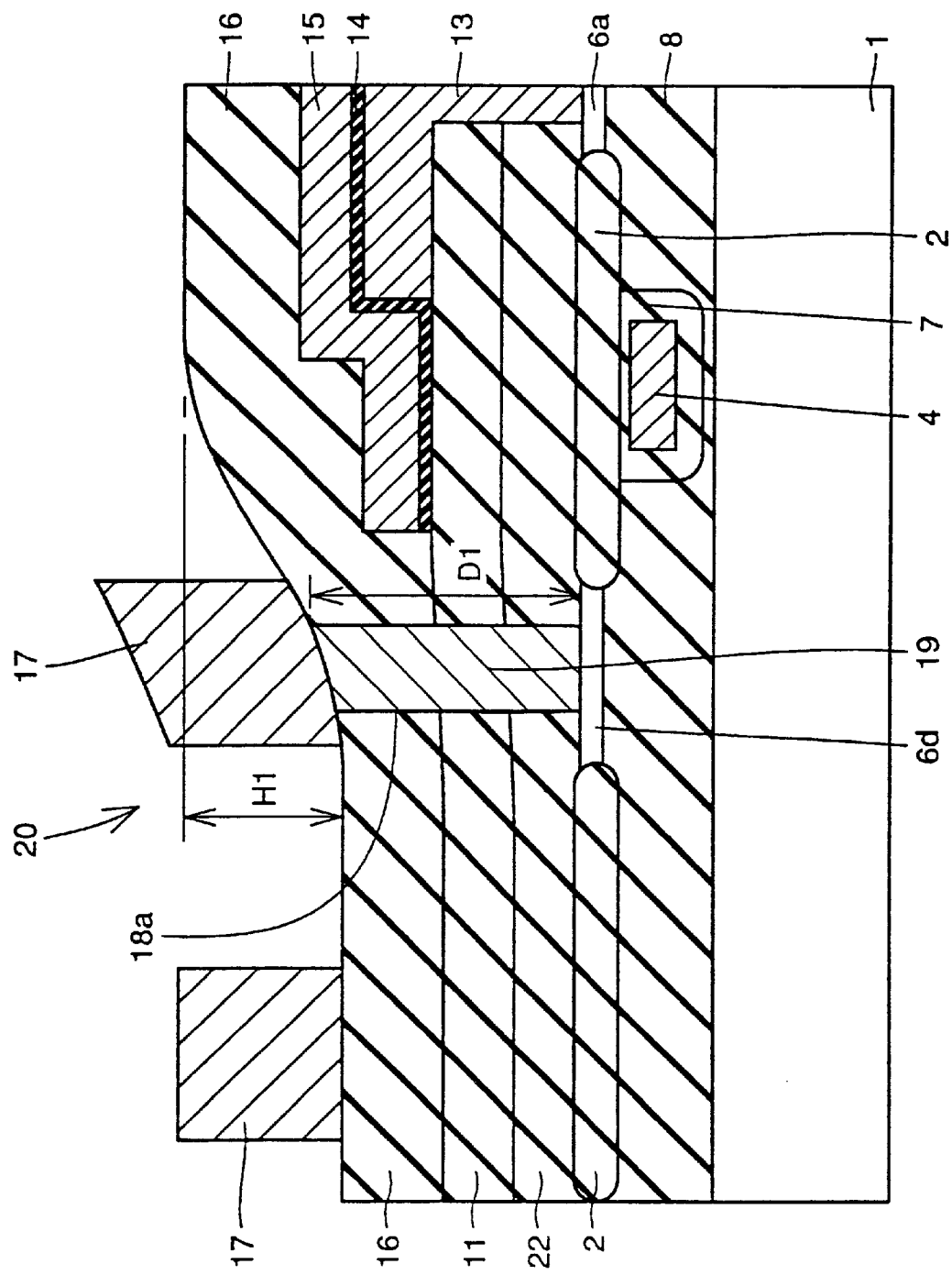
FIG. 2 is a cross section showing, on an enlarged scale, a boundary portion between a memory cell array and a peripheral circuitry in FIG. 1.

Referring to FIGS. 1 to 10, a first embodiment of the invention will now be described below. FIG. 1 is a cross section showing a DRAM of the first embodiment of the invention. FIG. 2 is a cross section showing, on an enlarged scale, a boundary portion between a memory cell array and a peripheral circuitry in FIG. 1. Referring to FIGS. 1 and 2, a structure of the DRAM of this embodiment will be described below.

In FIG. 1, a substrate 21 made of, e.g., silicon has a main surface, on which a first interlayer insulating layer 8 made of, e.g., a silicon oxide film is formed. First interlayer insulating layer 8 has a substantially uniform thickness over an area in the memory cell array and peripheral circuitry. A semiconductor layer (silicon layer) 1 is formed on first interlayer insulating layer 8. Semiconductor layer 1 is formed in the memory cell array and peripheral circuitry, and has a substantially flat upper surface. Element isolating oxide films 2 are selectively formed at semiconductor layer 1.

Switch MOS transistors 5 are formed in the memory cell array. Switch MOS transistors 5 have gate electrodes 4 as well as n-type impurity diffusion layers 6a, 6b and 6c. n-type impurity diffusion layers 6a, 6b and 6c are formed at the semiconductor layer 1 with a space between each other. The gate electrode 4 of switch MOS transistor 5 is formed under semiconductor layer 1. Gate electrode 4 is covered with an oxide film 7.

Under element isolating oxide films 2, there are formed word lines 4 connected to gate electrodes of other switch MOS transistors. As described above, gate electrodes (word lines) 4 of switch MOS transistors are formed under the semiconductor layer 1, whereby a level difference between the memory cell array and the peripheral circuitry can be reduced.

On semiconductor layer 1, there is formed an interlayer insulating layer 22 made of, e.g., a silicon oxide film and having a substantially flat upper surface. Interlayer insulating layer 22 is provided at a portion located above n-type impurity diffusion layer 6b with a contact hole 9a. A bit line 10 is formed in contact hole 9a. In this case, bit line 10 has a polycide structure including a polycrystalline silicon layer and a silicide layer formed on the polycrystalline silicon layer.

In the above structure, interlayer insulating layer 22 is required only to ensure insulation between bit line 10 and semiconductor layer 1, so that its thickness can be reduced. More specifically, the thickness can be reduced to a value from about 1000 Å to about 2000 Å. Thereby, the depth of contact hole 9a can be reduced.

Interlayer insulating layer 22 and bit line 10 are covered with a second interlayer insulating layer 11 made of, e.g., a silicon oxide film and having a substantially flat upper surface. Above n-type impurity diffusion layers 6a and 6c, there are formed contact holes 25a penetrating interlayer insulating layer 22 and second interlayer insulating layer 11.

A capacitor lower electrode 13 made of, e.g., polycrystalline silicon extends from contact holes 25a to an area over second interlayer insulating layer 11. The surface of capacitor lower electrode 13 is covered with a capacitor dielectric film 14 made of a material having a relatively high dielectric constant such as a composite film of a silicon nitride film and a silicon oxide film. A capacitor upper electrode 15 made of, e.g., a polycrystalline silicon layer is formed on the surface of capacitor dielectric film 14. Capacitor upper electrode 15, capacitor dielectric film 14 and capacitor lower electrode 13 form a capacitor 12 for storing electric charges.

Capacitor upper electrode 15 is covered with a third interlayer insulating layer 16 made of, e.g., a silicon oxide film. Interconnection layers 17 made of, e.g., aluminum (Al) or tungsten (W) are formed on third interlayer insulating layer 16. An n-type impurity diffusion layer 6d is formed in a portion of semiconductor layer 1 located in the peripheral circuitry adjacent to the memory cell array.

n-type impurity diffusion layer 6d is located under a stepped portion 20 formed at a boundary between the memory cell array and peripheral circuitry. At stepped portion 20, there is formed a contact hole 18a which penetrates third interlayer insulating layer 16, second interlayer insulating layer 11 and interlayer insulating layer 22, and reaches the surface of n-type impurity diffusion layer 6d. A plug electrode 19 made of, e.g., tungsten (W) is formed in contact hole 18a to make electrical connection between interconnection layer 17 and n-type impurity diffusion layer 6d.

Referring to FIGS. 1 and 2, distinctive features of this embodiment will be described below. Referring first to FIG. 1, since the thickness of interlayer insulating layer 22 can be small as already described, contact holes 9a and 25a can also be shallow. Thereby, contact holes 9a and 25a can be formed more easily than the prior art.

Referring to FIGS. 1 and 2, gate electrode (word line) 4 is formed in first interlayer insulating layer 8 and is located under semiconductor layer 1 or element isolating oxide film 2. First interlayer insulating layer 8 has a substantially uniform thickness over the memory cell array and the peripheral circuitry as shown in FIG. 1. Therefore, it is possible to suppress a level difference between the memory cell array and peripheral circuitry which may be caused by gate electrode 4. As a result, level difference HI between the peripheral circuitry and memory cell array is substantially equal to a thickness of capacitor 12. Therefore, the level difference between the memory cell array and peripheral circuitry can be smaller than that in the prior art. Consequently, interconnection layers 17 can be formed easily, and failure in patterning of interconnection layers 17, which may be caused by stepped portion 20, can be effectively prevented. Accordingly, reliability of the DRAM can be improved.

Since the thickness of interlayer insulating layer 22 can be reduced as described above, a depth D1 of contact hole 18a in the peripheral circuitry can be smaller than that in the prior art. Thereby, contact hole 18a can be formed easily, and generation of a void in plug electrode 19 can be effectively suppressed. This also improves reliability of the DRAM.

Referring to FIGS. 3 to 10, a method of manufacturing the DRAM of the first embodiment of the invention will be described below. FIGS. 3 to 10 are cross sections showing 1st to 8th steps in a process of manufacturing the DRAM of the first embodiment of the invention.

Figure 3:
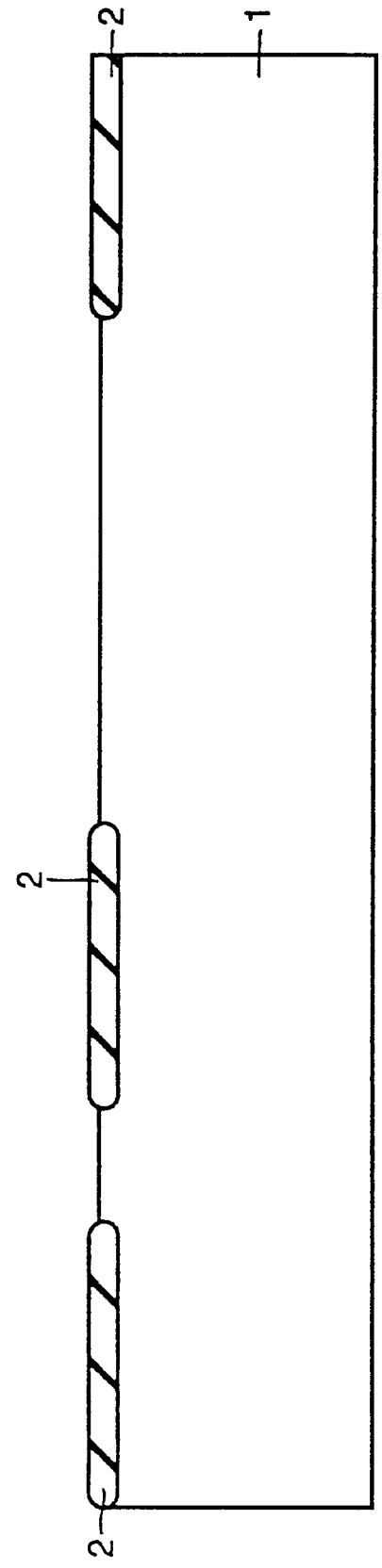
FIGS. 3 to 10 are cross sections showing 1st to 8th steps in a process of manufacturing the DRAM shown in FIG. 1, respectively.
Figure 4:
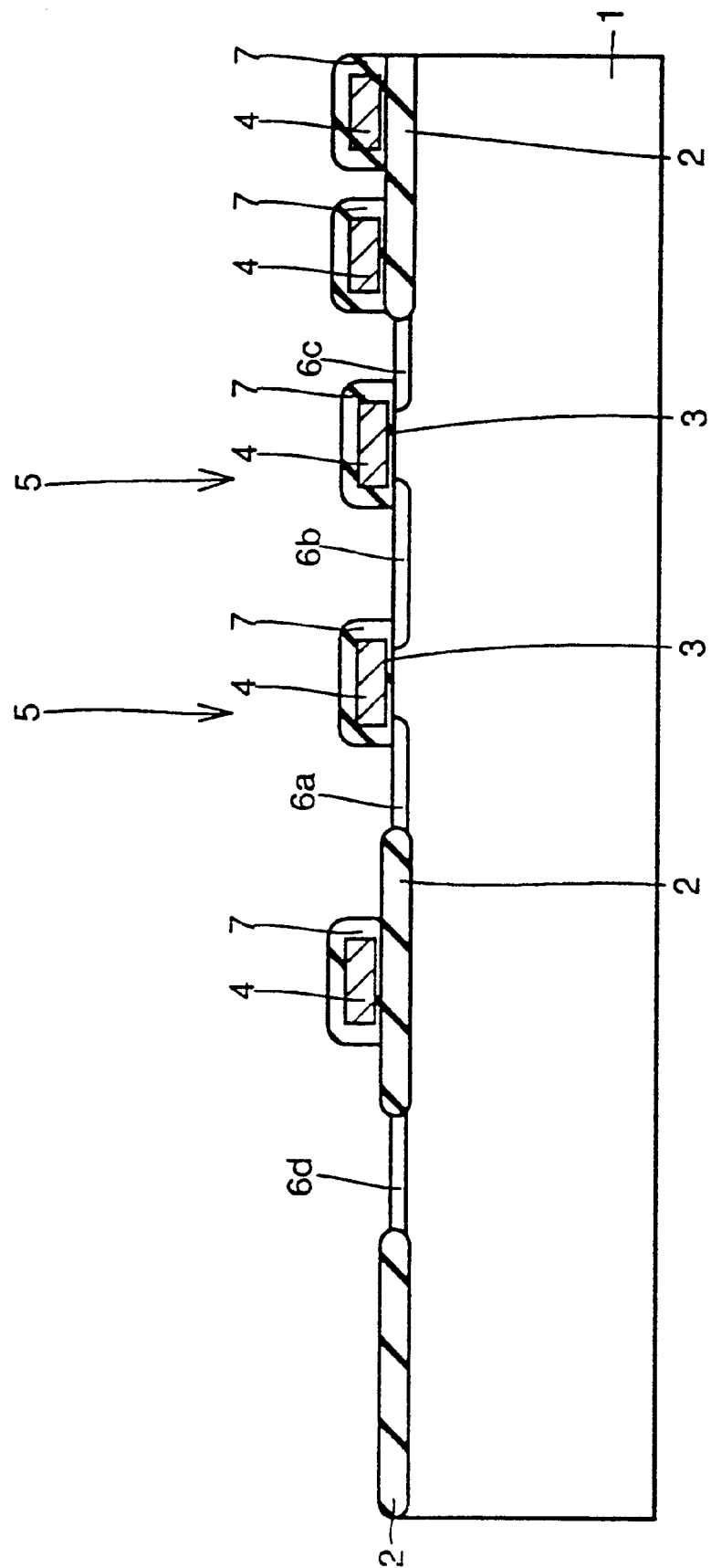

Referring to FIG. 3, element isolating oxide films 2 are formed on the main surface of p-type silicon substrate 1 by an LOCOS (Local Oxidation of Silicon). Referring to FIG. 4, thermal oxidation is effected on the main surface of silicon substrate 1. Then, a CVD (Chemical Vapor Deposition) method is performed to form a polycrystalline silicon layer. A silicon oxide film is formed on this polycrystalline silicon layer, e.g., by the CVD method. Then, the polycrystalline silicon layer and silicon oxide film are patterned. Thereby, gate electrodes (word lines) 4 and gate oxide films 3 are formed. Using gate electrodes 4 as a mask, n-type impurity is implanted into the main surface of p-type silicon substrate 1. Thereby, n-type impurity diffusion layers 6a, 6b, 6c and 6d are formed. Oxide films 7 are formed over gate electrodes (word lines) 4. In this manner, switch MOS transistors 5 are formed.

Figure 5:
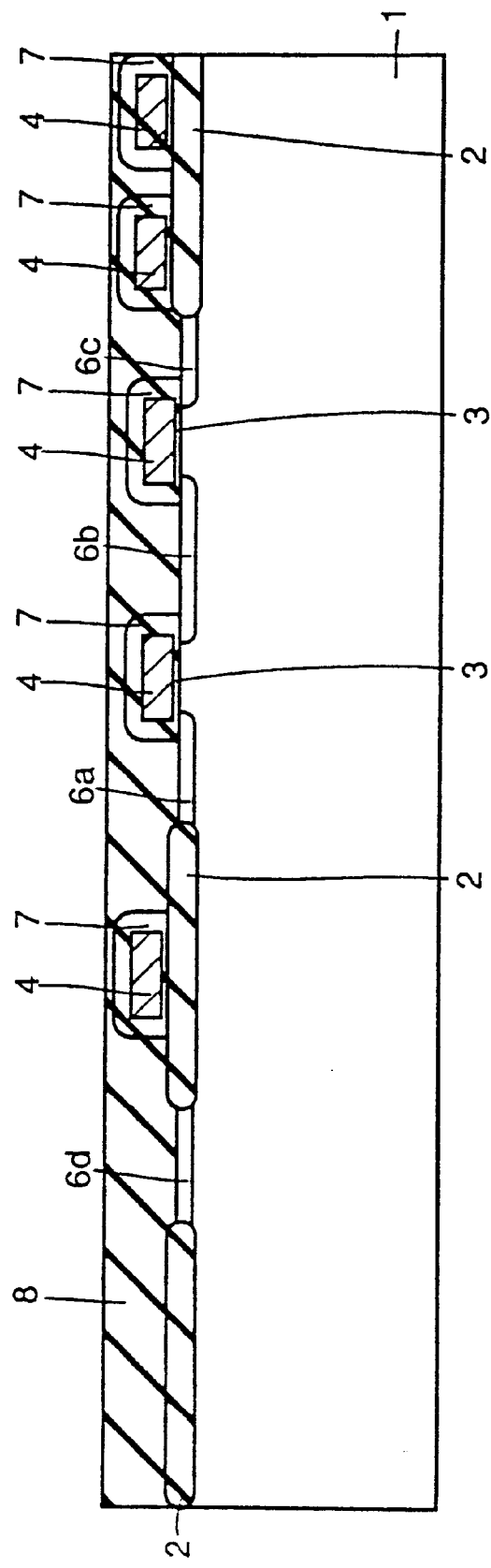
Figure 6:
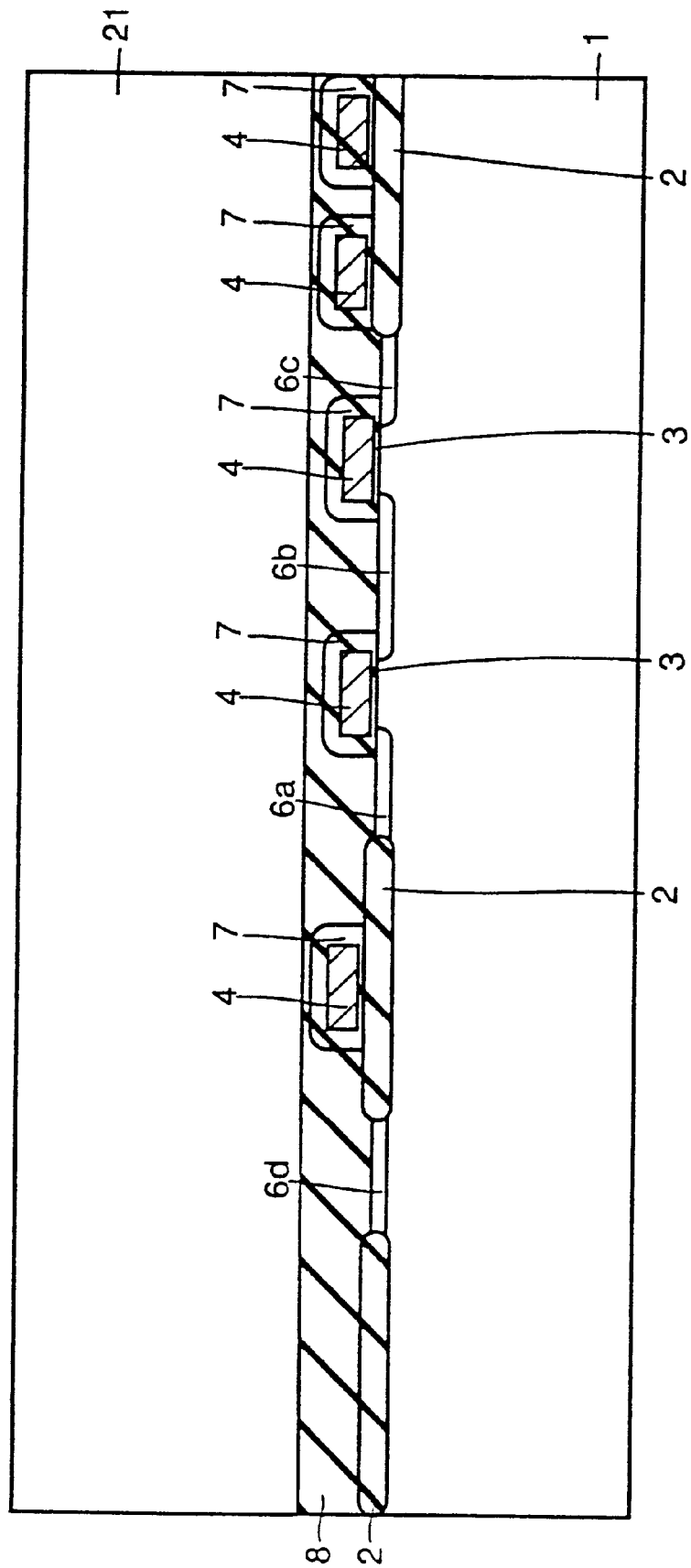

Referring to FIG. 5, the CVD method or the like is performed to form first interlayer insulating layer 8 made of, e.g., a silicon oxide film on the whole main surface of p-type silicon substrate 1. Etchback is effected on the upper surface of first interlayer insulating layer 8 to flatten the same. Referring to FIG. 6, substrate 21 made of, e.g., silicon is joined to the upper surface of first interlayer insulating layer 8. The joining in this case can be performed, for example, by heating or with adhesive.

Figure 7:
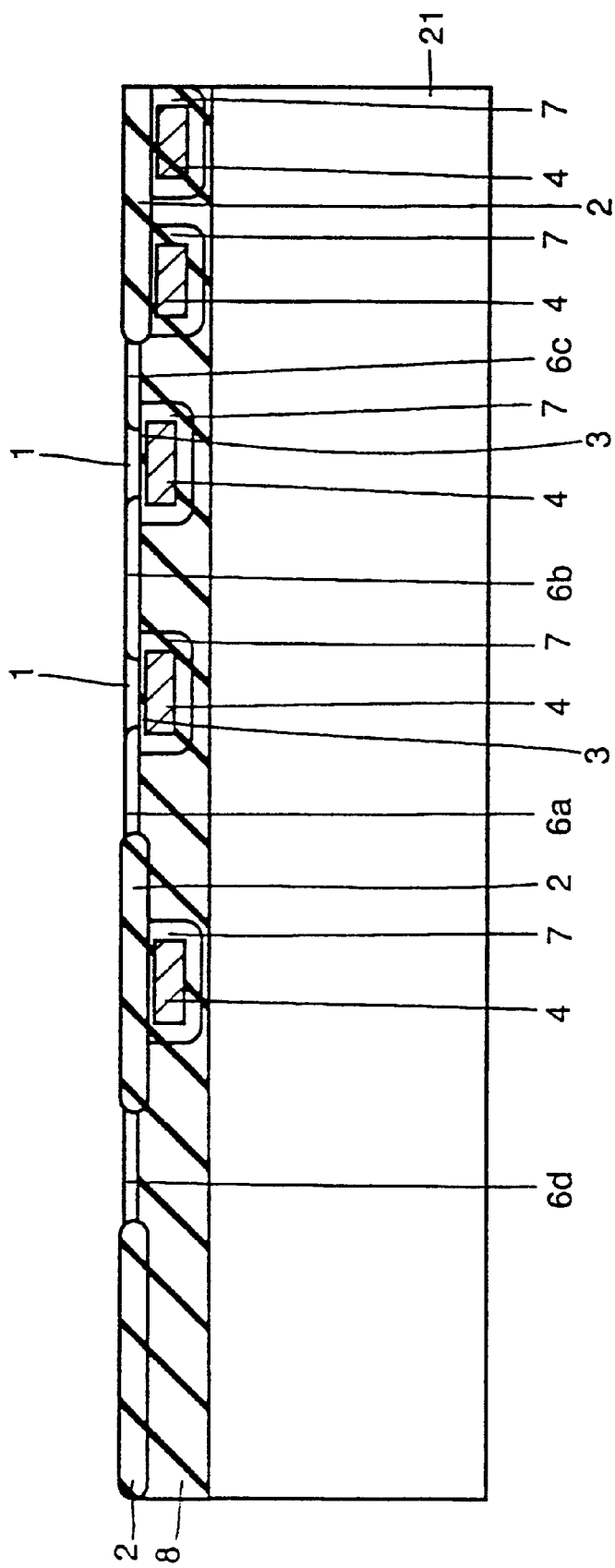

Referring to FIG. 7, processing is effected on the rear surface of silicon substrate 1 to reduce the thickness of silicon substrate 1. More specifically, the rear surface of silicon substrate 1 is polished by a CMP (Chemical Mechanical Polishing) method or the like. In this manner, semiconductor layer 1 is formed.

Figure 8:
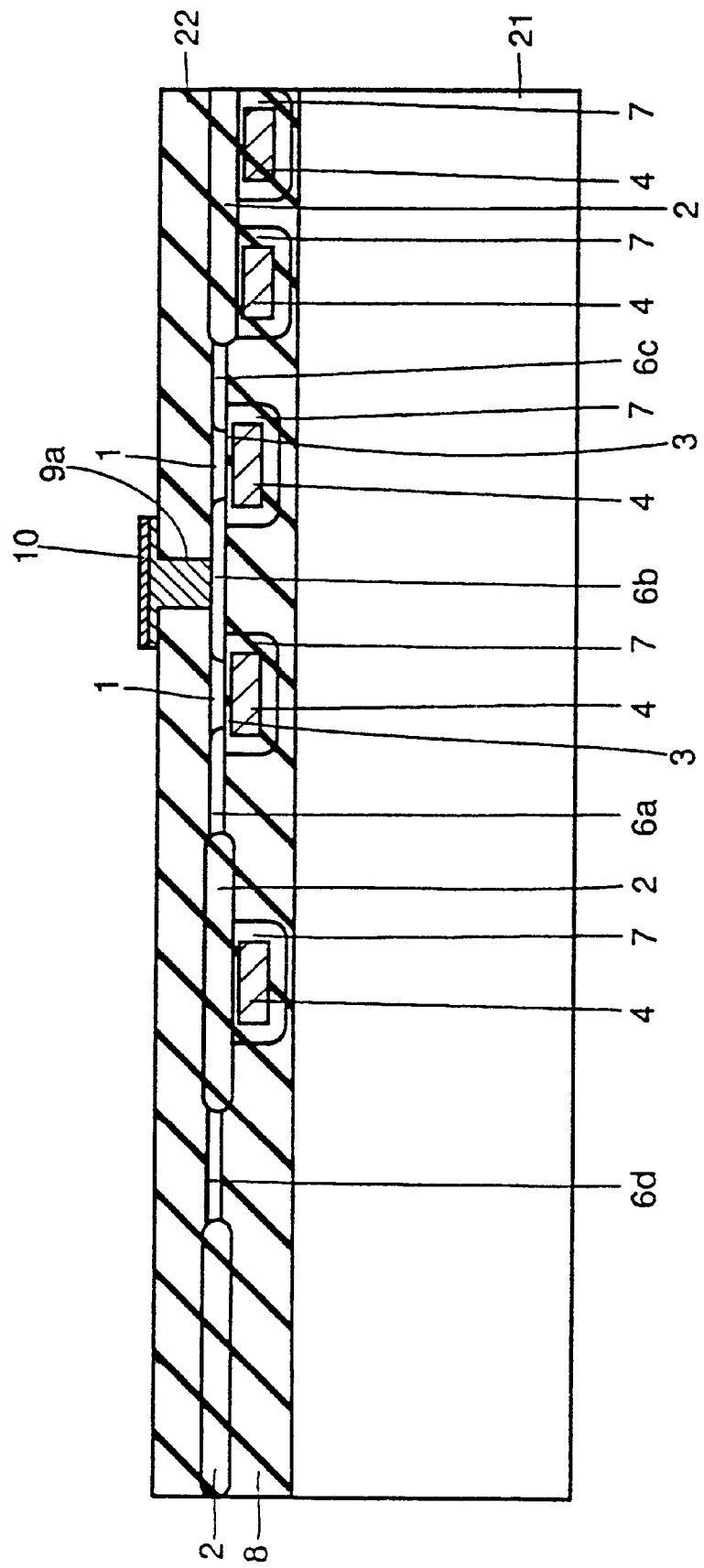

Referring to FIG. 8, the CVD method or the like is performed to form interlayer insulating layer 22 made of, e.g., a silicon oxide film covering semiconductor layer 1. Interlayer insulating layer 22 thus formed has a thickness from about 1000 Å to about 2000 Å. Contact hole 9a reaching the surface of n-type impurity diffusion layer 6b is formed at interlayer insulating layer 22. In this processing, contact hole 9a can be formed easily, because interlayer insulating layer 22 is thin as described before. Bit line 10 is formed in contact hole 9a.

Figure 9:
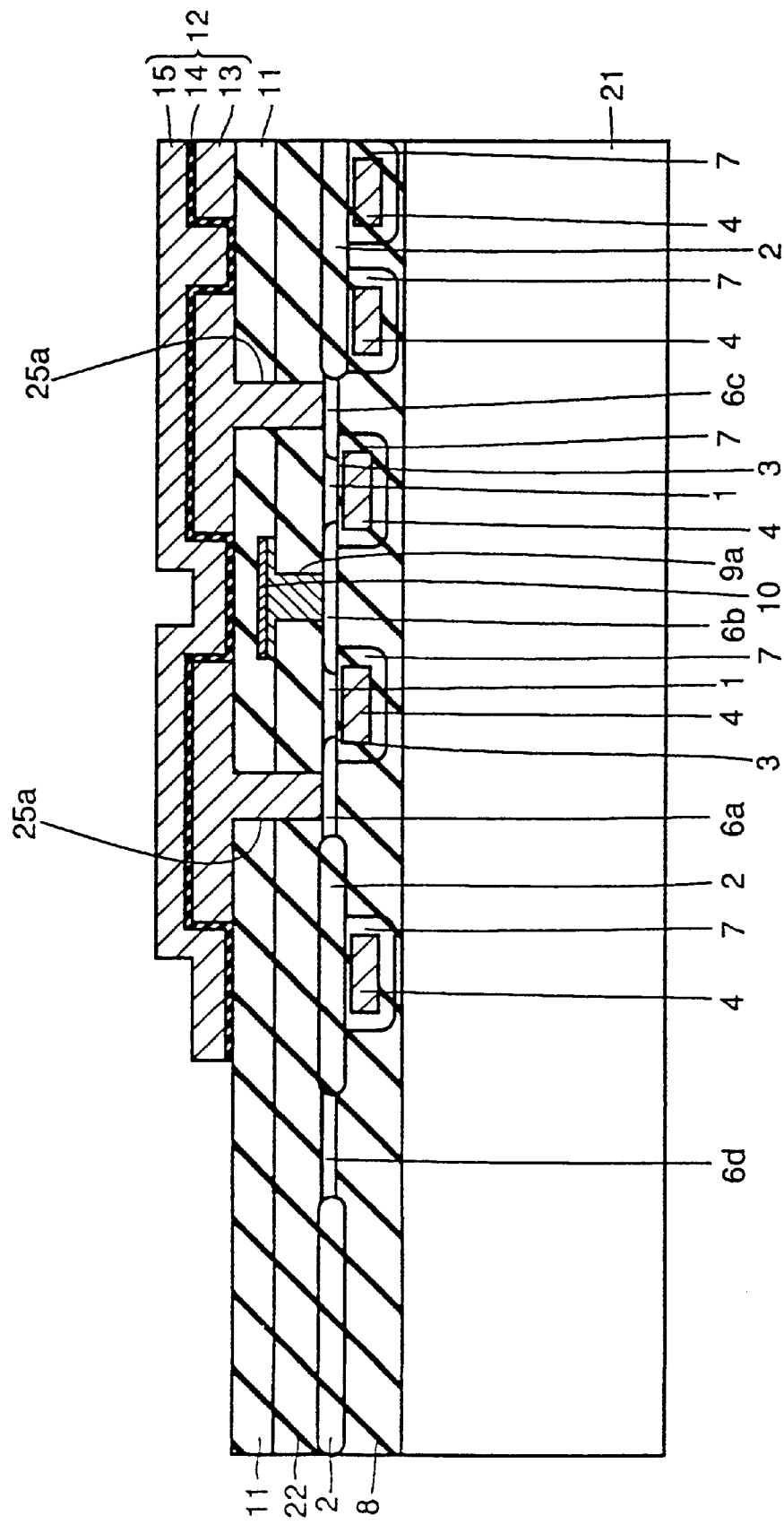

Referring to FIG. 9, the CVD method or the like is performed to form second interlayer insulating layer 11 made of, e.g., a silicon oxide film and covering bit line 10 and interlayer insulating layer 22. Contact holes 25a reaching the surfaces of n-type impurity diffusion layers 6a and 6c are formed at second interlayer insulating layer 11 and interlayer insulating layer 22. Contact holes 25a thus formed can also be shallow because interlayer insulating layer 22 is thin. Accordingly, contact holes 25a can be formed easily.

A polycrystalline silicon layer is formed in contact holes 25a and over second interlayer insulating layer 11 by the CVD method or the like. This polycrystalline silicon layer is patterned to form a capacitor lower electrode 13. A silicon nitride film covering capacitor lower electrode 13 is formed by the CVD method or the like. Thermal oxidation is effected on this silicon nitride film to oxidize the surface of the silicon nitride film. This silicon nitride film is patterned to form capacitor dielectric film 14. A polycrystalline silicon layer is formed on capacitor dielectric film 14 by the CVD method or the like. This polycrystalline silicon layer is patterned to form capacitor upper electrode 15.

Figure 10:
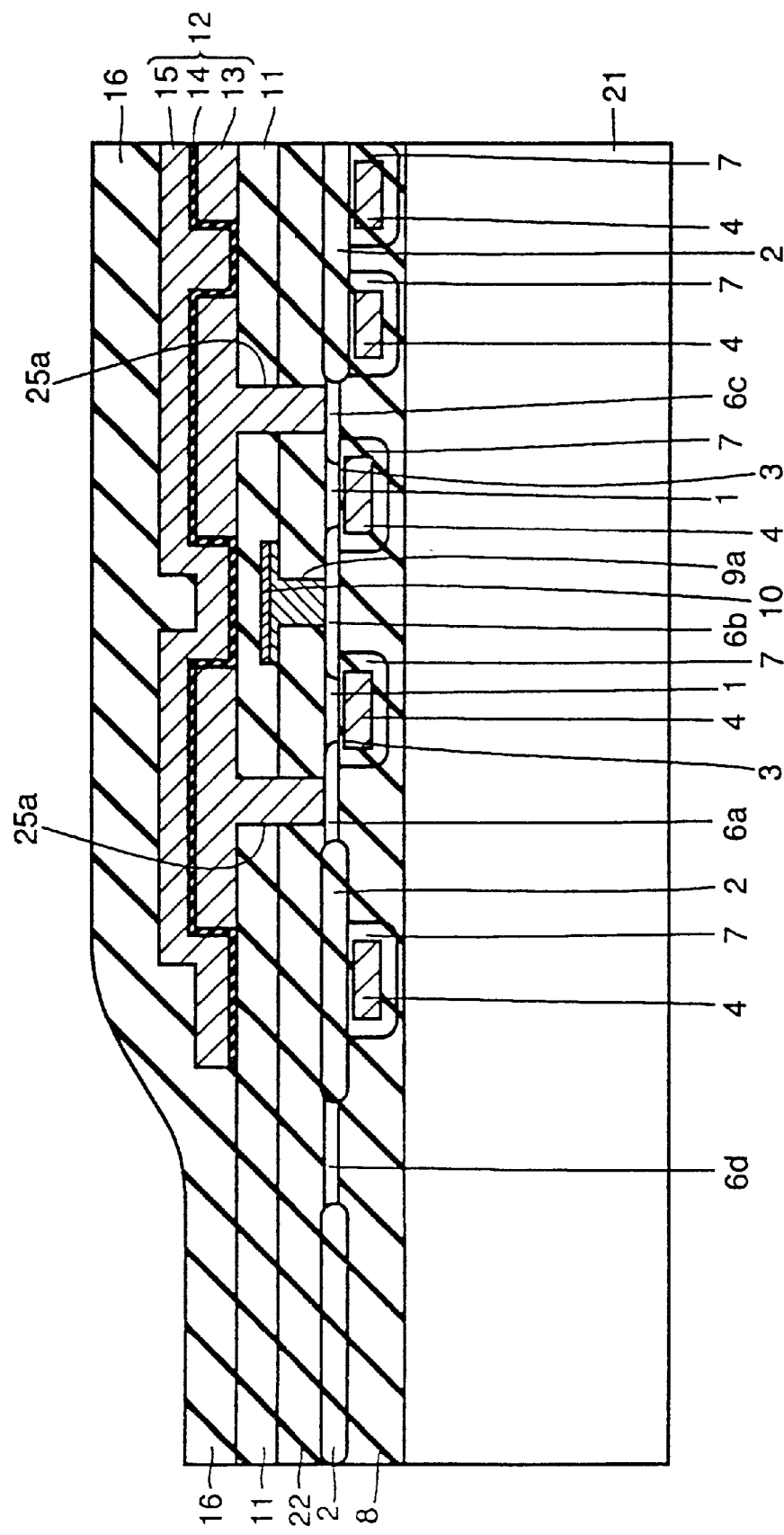

Referring to FIG. 10, third interlayer insulating layer 16 made of, e.g., a silicon oxide film is formed to cover capacitor upper electrode 15 and second interlayer insulating layer 11 by the CVD method or the like. Referring to FIG. 1, contact hole 18a penetrating third interlayer insulating layer 16, second interlayer insulating layer 11 and interlayer insulating layer 22 and reaching the surface of n-type impurity diffusion layer 6d is formed. Also in this case, since interlayer insulating layer 22 is thin, the depth of contact hole 18a can be small. Therefore, contact hole 18a can be formed easily.

Plug electrode 19 made of, e.g., tungsten (W) is formed in contact hole 18a by the CVD method or the like. A sputtering method or the like is performed to form a metal layer made of an aluminum (Al) layer of a tungsten (W) layer on third interlayer insulating layer 16. This metal layer is patterned to form interconnection layers 17. Even in the case where interconnection layer 17 is to be formed on stepped portion 20 between the memory cell array and peripheral circuitry, failure in patterning of interconnection layers 17 can be effectively prevented, because a level difference between the memory cell array and peripheral circuitry is reduced. Thereby, the DRAM can have high reliability.

(Second Embodiment)

Figure 11:
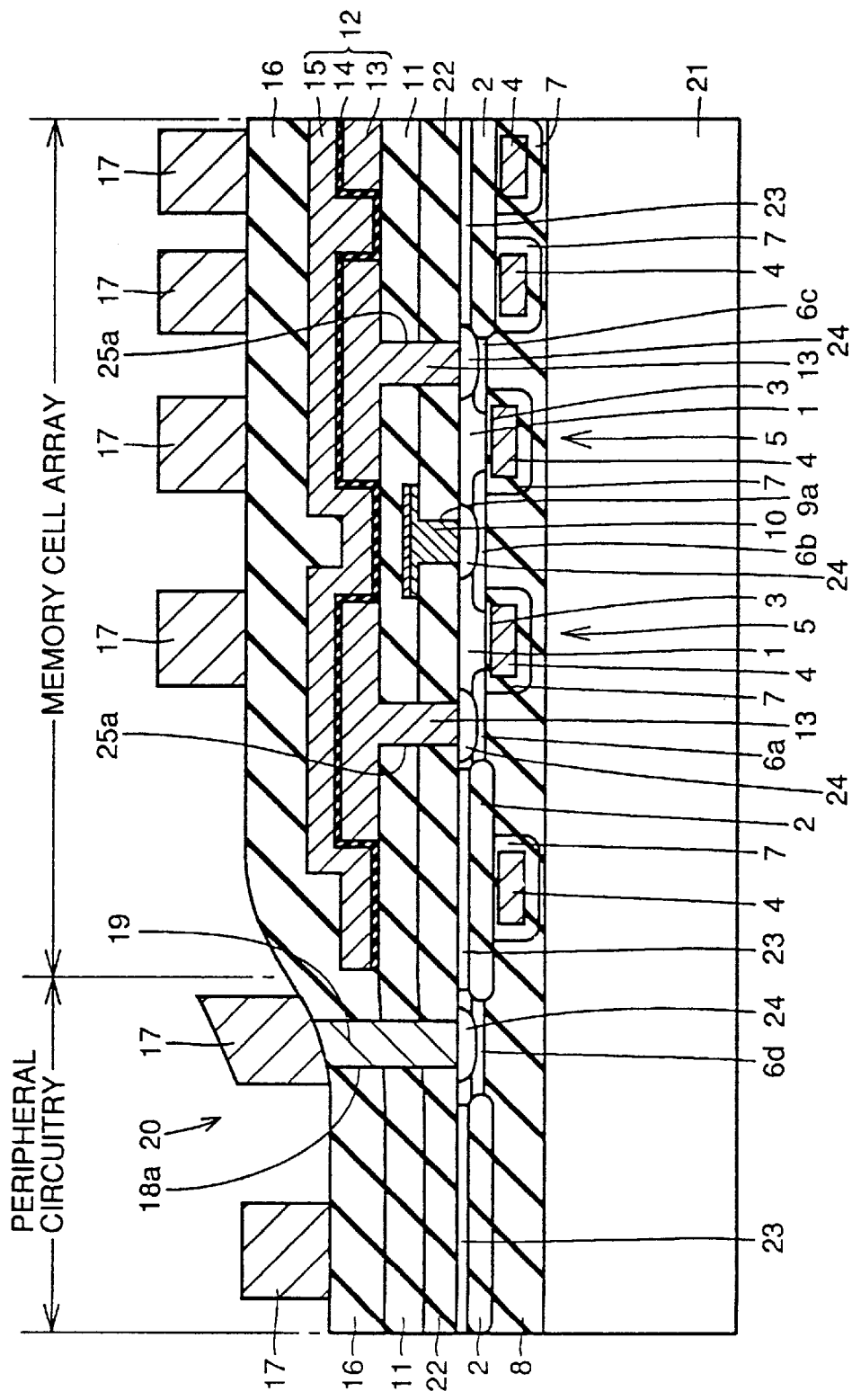
FIG. 11 is a cross section showing a DRAM of a second embodiment of the invention.

A second embodiment of the invention will be described below with reference to FIGS. 11 to 19. FIG. 11 is a cross section showing a DRAM of the second embodiment of the invention.

In this embodiment, as shown in FIG. 11, semiconductor layer 1 has portions remaining on element isolating oxide films 2. p-type impurity diffusion layers 23 for isolating elements are formed at portions of semiconductor layer 1 located above element isolating oxide films 2. Thereby, semiconductor layer 1 in the peripheral circuitry is electrically connected to semiconductor layer 1 in the memory cell array.

In the first embodiment described before, the semiconductor layer is divided into portions completely isolated from each other by element isolating oxide films 2. Therefore, unpreferable variation of the potential at channel region of switch MOS transistor 5 is likely to occur. Meanwhile, in this second embodiment, the semiconductor layer in the peripheral circuitry is electrically connected to the semiconductor layer in the memory cell array, whereby it is possible to suppress variation of the potential at the channel region of switch MOS transistor 5. Therefore, the DRAM can have high reliability.

At the semiconductor layer 1, there are provided n-type impurity diffusion layers 24 which form a contact portion between plug electrode 19 and semiconductor layer 1, a contact portion between capacitor lower electrode 13 and semiconductor layer 1, and a contact portion between bit line 10 and semiconductor layer 1. Structures other than the above are the same as those of the DRAM of the first embodiment shown in FIG. 1.

Referring now to FIGS. 12 to 19, a method of manufacturing the DRAM of the second embodiment of the invention will be described below. FIGS. 12 to 19 are cross sections showing 1st to 8th steps in a process of manufacturing the DRAM of the second embodiment of the invention.

Figure 12:
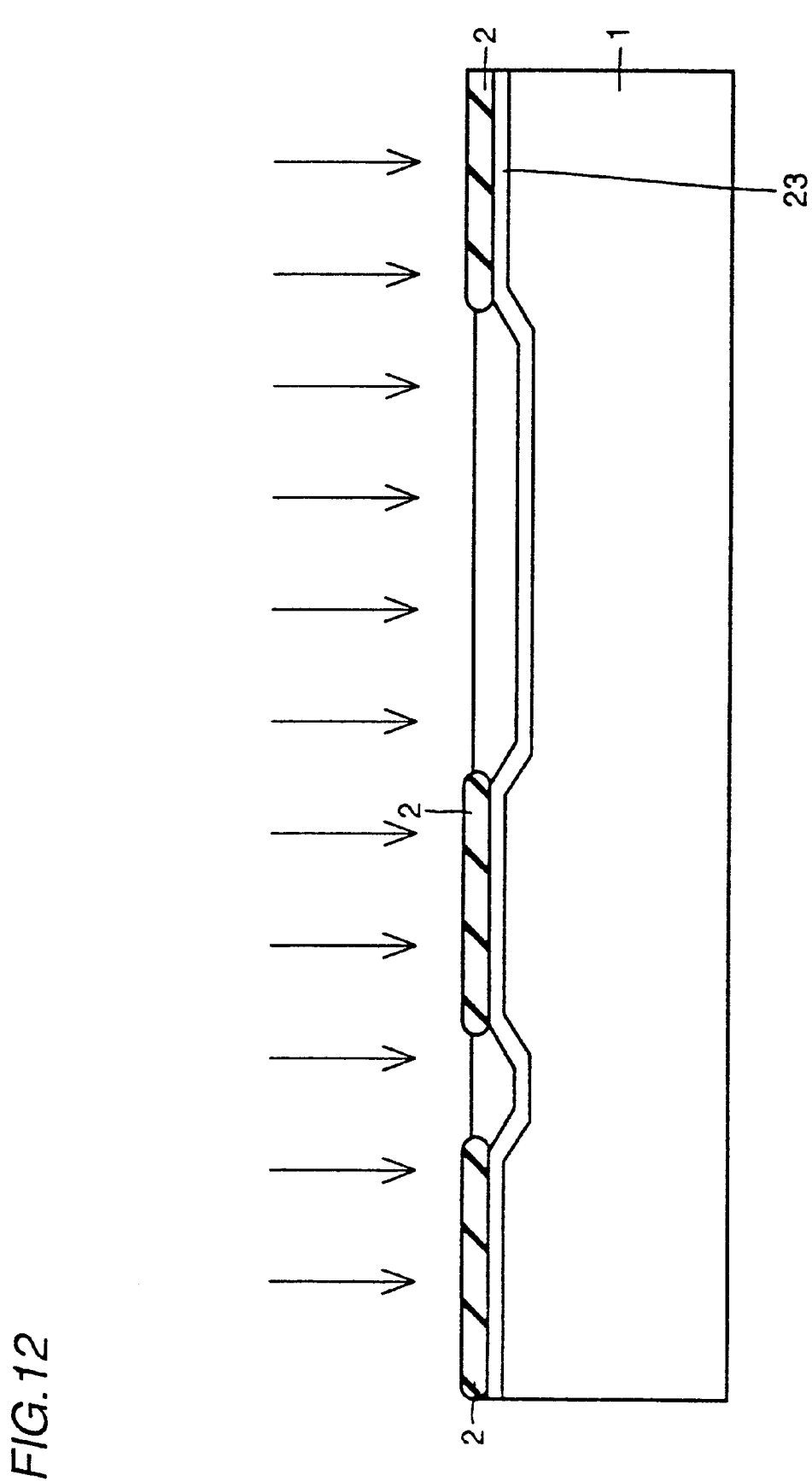
FIGS. 12 to 19 are cross sections showing 1st to 8th steps in a process of manufacturing the DRAM shown in FIG. 11, respectively.

Referring first to FIG. 12, element isolating oxide films 2 are formed selectively on the main surface of p-type silicon substrate 1 by the steps similar to those of the first embodiment described before. p-type impurity such as boron (B) is implanted into the main surface of the p-type silicon substrate 1 with an energy allowing the impurity to penetrate element isolating oxide films 2. Thereby, p-type impurity diffusion layers 23 for isolating elements are formed.

Figure 13:
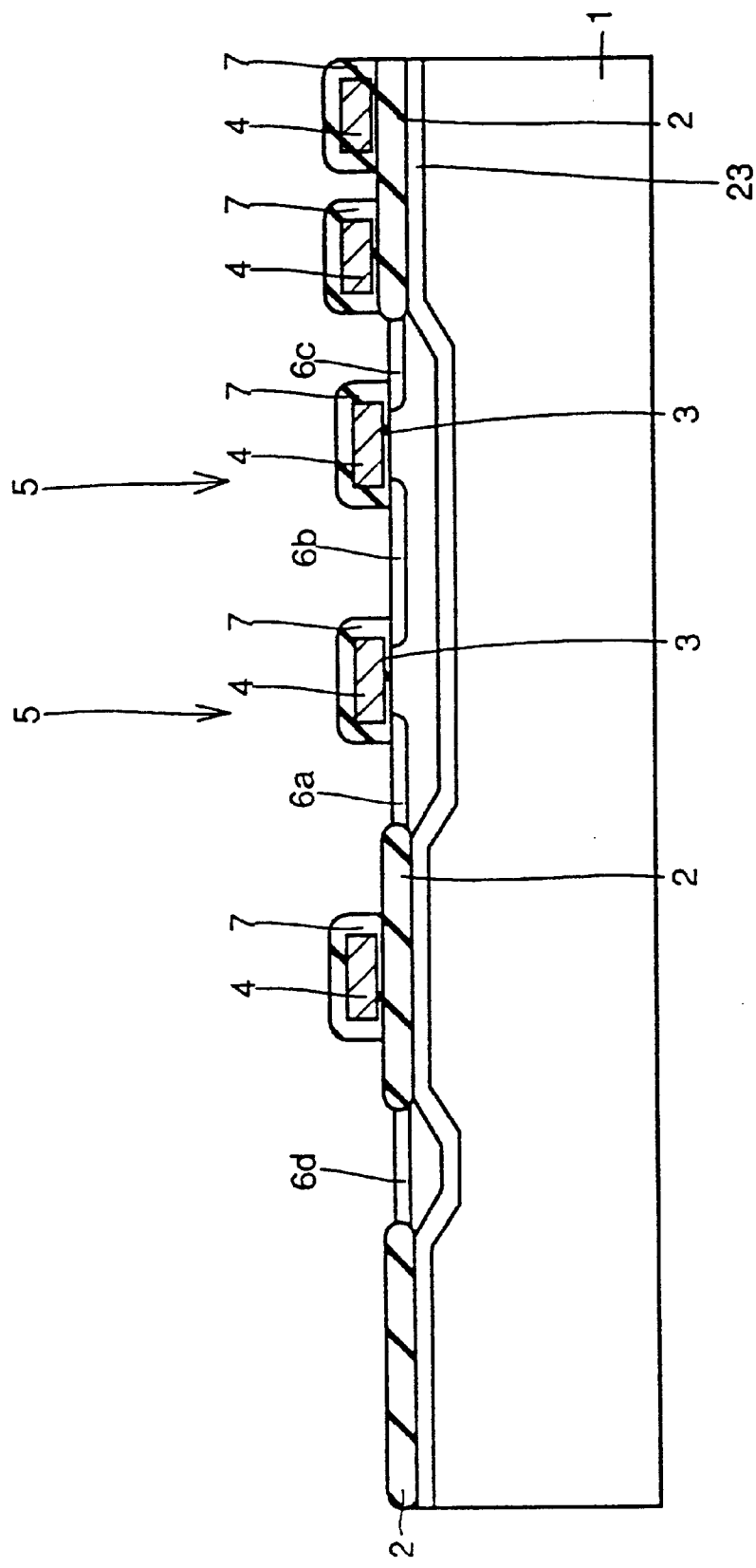
Figure 14:
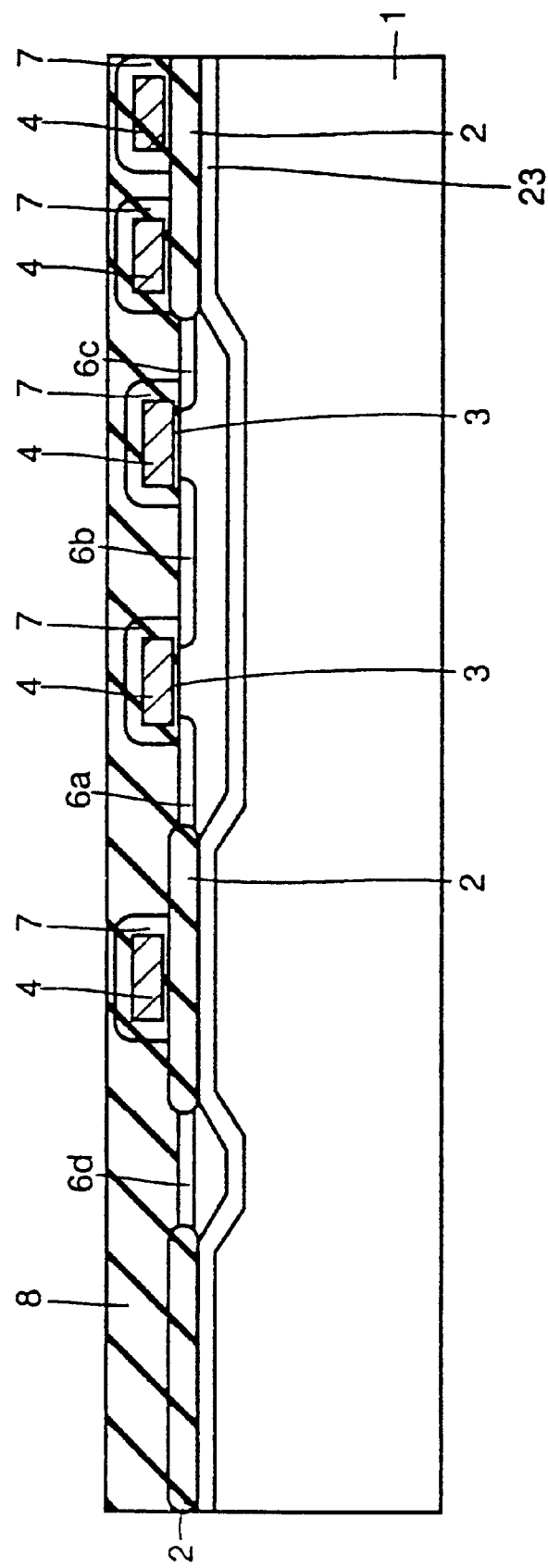

Referring to FIG. 13, gate electrodes (word lines) 4, n-type impurity diffusion layers 6a, 6b, 6c and 6d, and oxide films 7 are formed by the steps similar to those of the first embodiment already described. Referring to FIG. 14, first interlayer insulating layer 8 is formed by the steps similar to those of the first embodiment.

Figure 15:
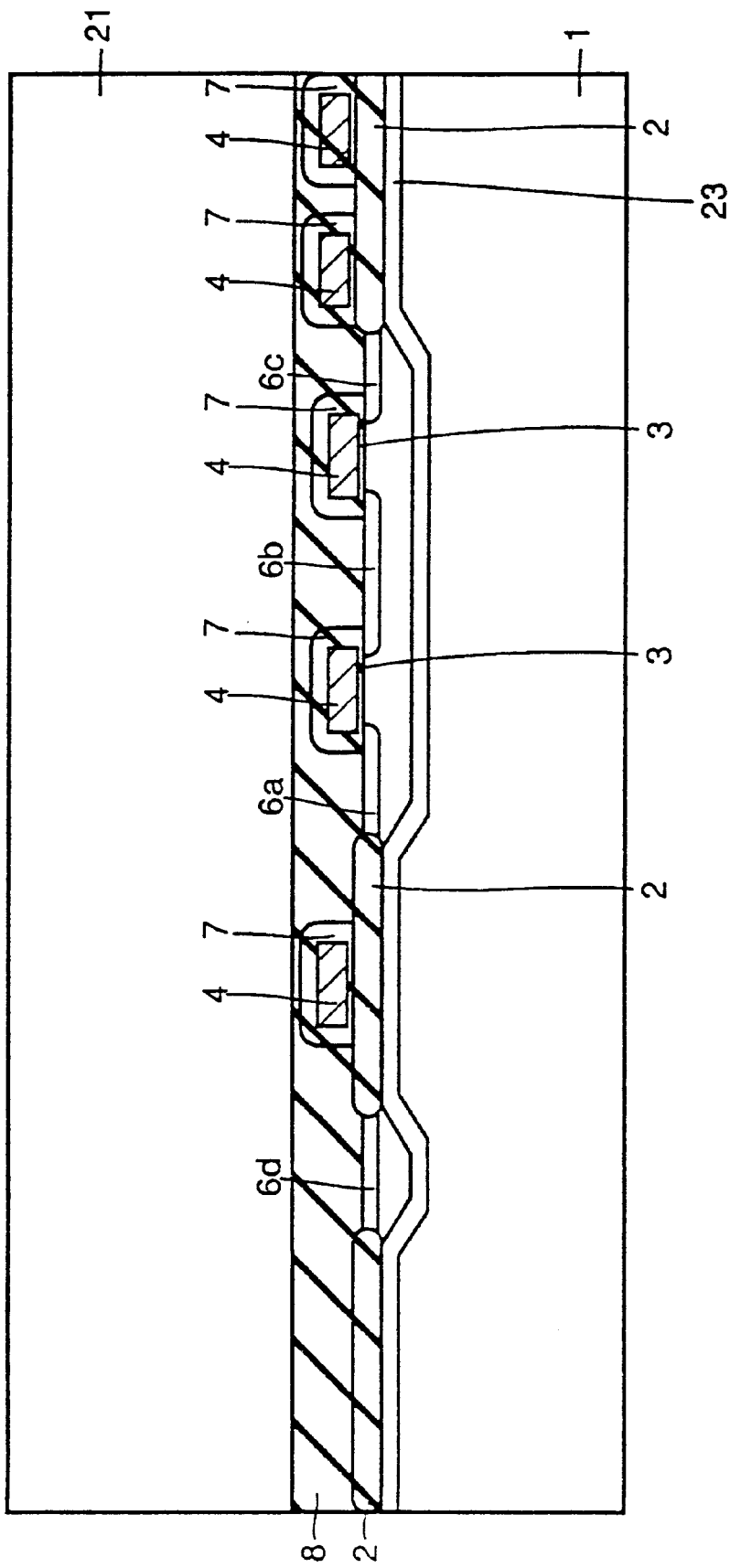
Figure 16:
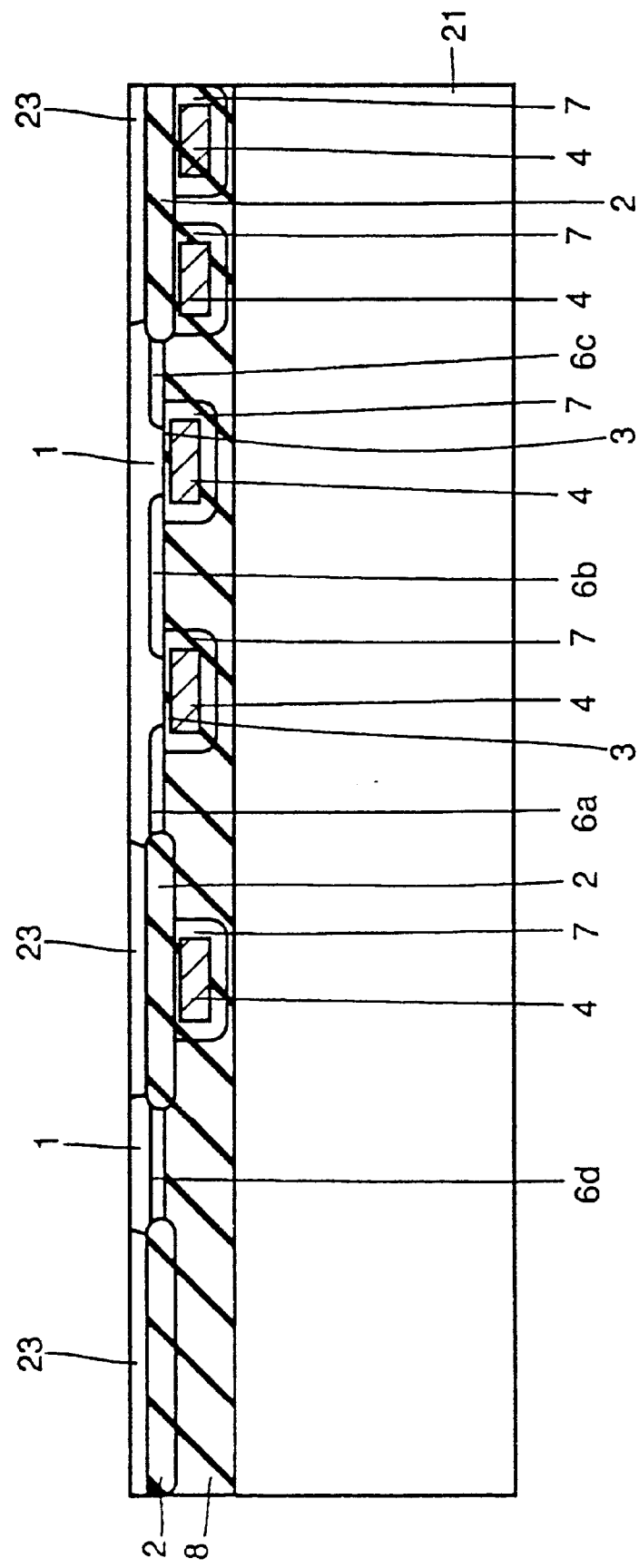

Referring to FIG. 15, substrate 21 is joined to the upper surface of first interlayer insulating layer 8 by the steps similar to those of the first embodiment. As shown in FIG. 16, the thickness of silicon substrate 1 is reduced by the steps similar to those of the first embodiment. This processing in the second embodiment is performed to leave p-type impurity diffusion layers 23 on element isolating oxide films 2. Thereby, the thickness of semiconductor layer 1 is slightly larger than that in the first embodiment, and semiconductor layer 1 located in the memory cell array is electrically connected to semiconductor layer 1 located in the peripheral circuitry via p-type impurity diffusion layer 23. Therefore, it is possible to prevent effectively the rise of potential at the channel region of switch MOS transistor 5 in the memory cell array.

Figure 17:
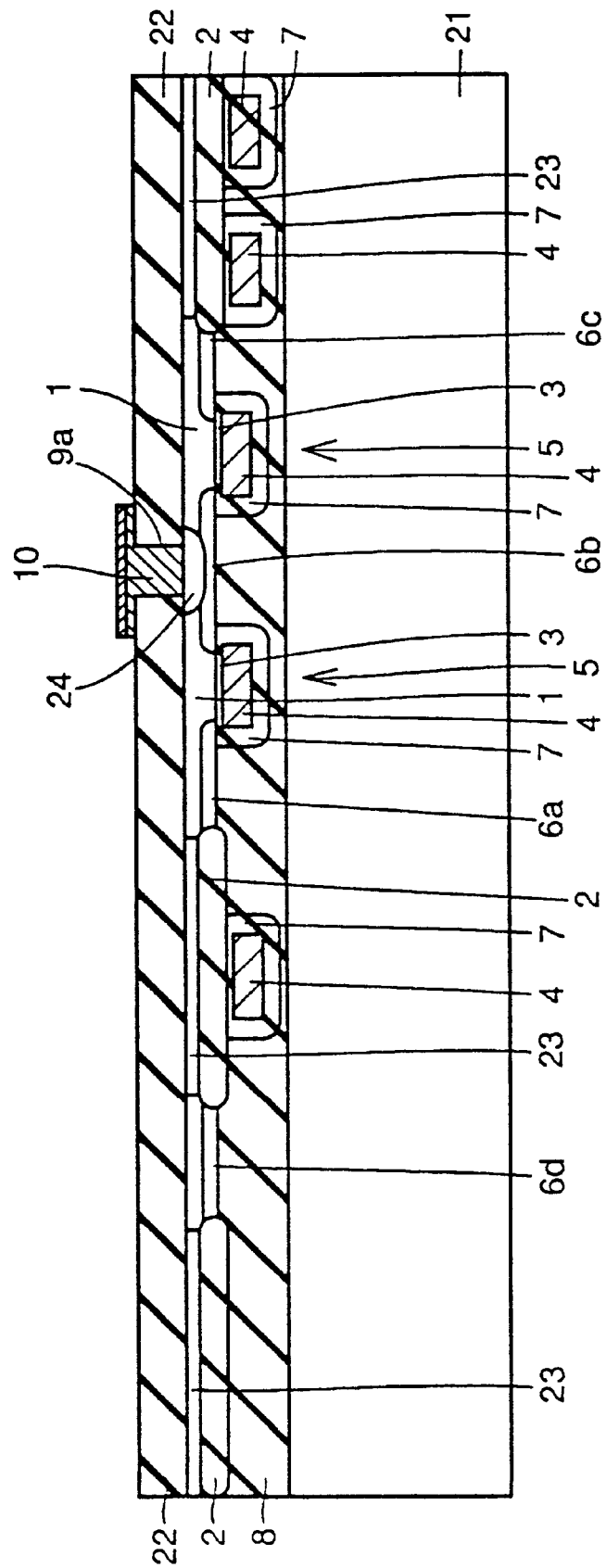

Referring to FIG. 17, interlayer insulating layer 22 is formed on semiconductor layer 1 by the steps similar to those of the first embodiment. Contact hole 9a is formed at a predetermined position in interlayer insulating layer 22. n-type impurity is introduced into semiconductor layer 1 through contact hole 9a to form n-type impurity diffusion layer 24. Thereafter, bit line 10 is formed in contact hole 9a by the steps similar to those of the first embodiment.

Figure 18:
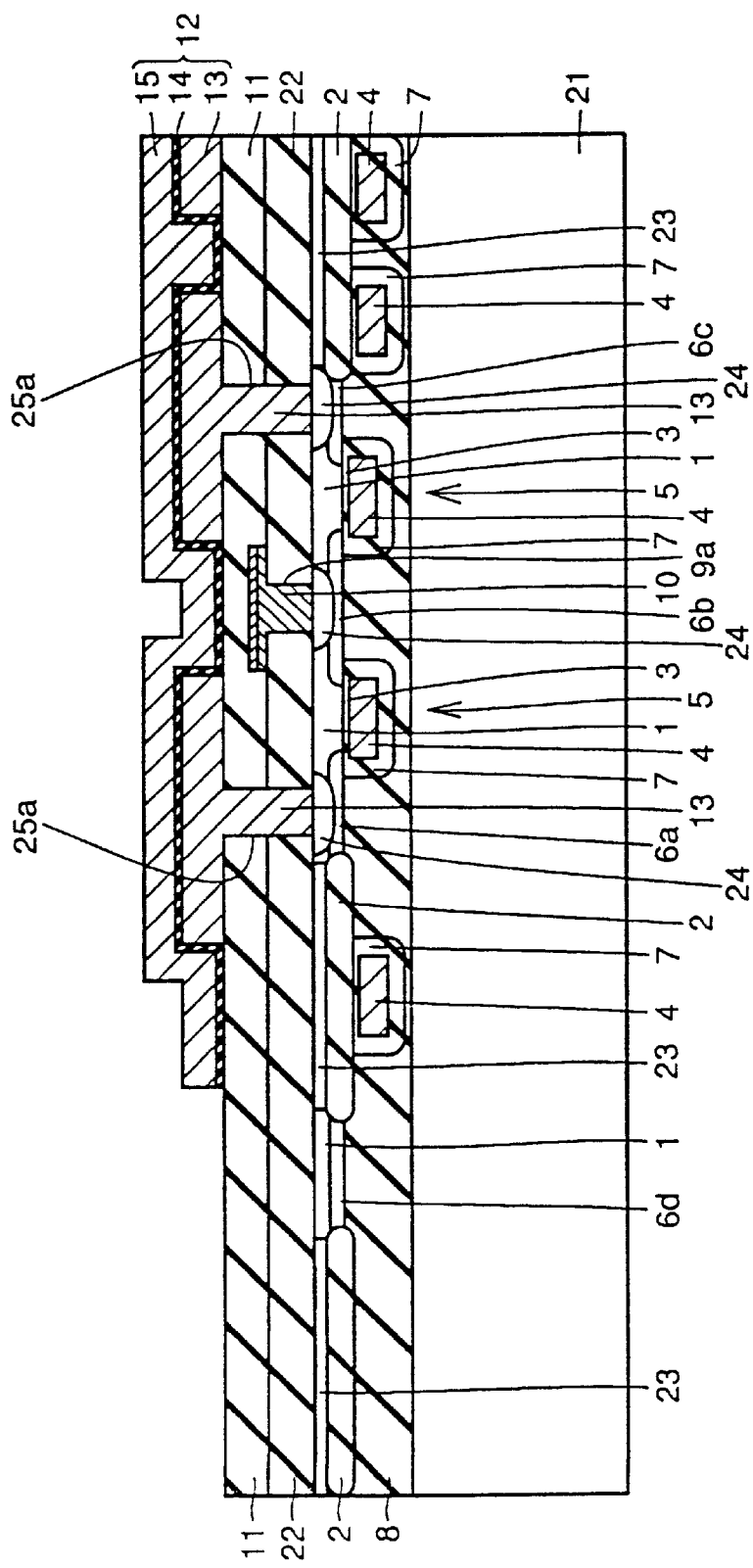

Referring to FIG. 18, second interlayer insulating layer 11 is formed on interlayer insulating layer 22, and contact holes 25a penetrating second interlayer insulating layer 11 and interlayer insulating layer 22 are formed by the steps similar to those of the first embodiment. n-type impurity is introduced into semiconductor layer 1 through contact holes 25a. Thereby, n-type impurity diffusion layers 24 are formed. Thereafter, capacitor lower electrode 13, capacitor dielectric film 14 and capacitor upper electrode 15 are formed by the steps similar to those of the first embodiment. Thereby, capacitor 12 is formed.

Figure 19:
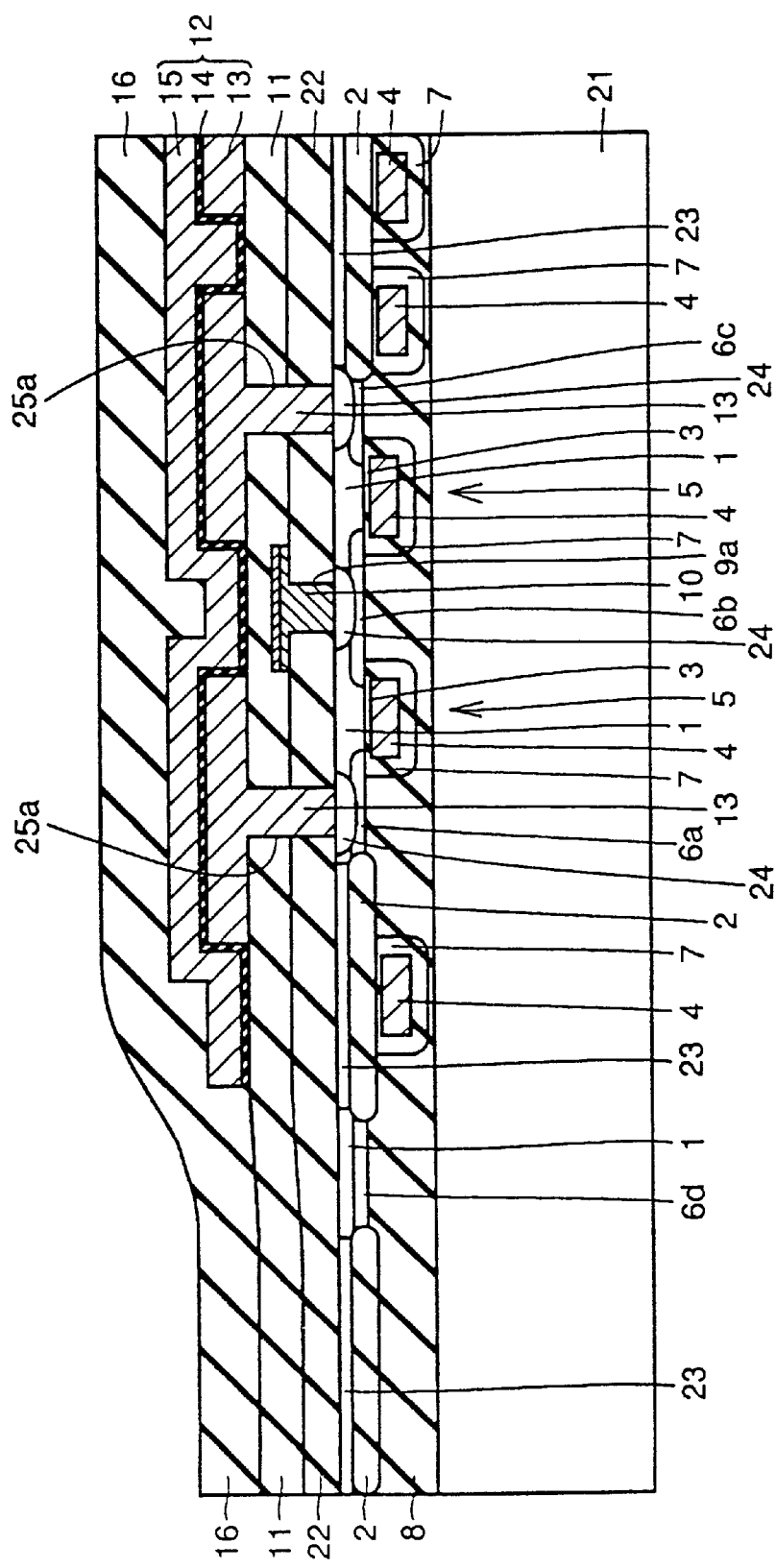

Referring to FIG. 19, third interlayer insulating layer 16 covering capacitor upper electrode 15 is formed by the steps similar to those of the first embodiment. Referring to FIG. 11, contact hole 18a is formed in the peripheral circuitry, and n-type impurity is introduced into semiconductor layer 1 through contact hole 18a. Thereby, n-type impurity diffusion layer 24 is formed. Thereafter, steps similar to those of the first embodiment are performed, so that the DRAM shown in FIG. 11 is completed.

(Third Embodiment)

Figure 20:
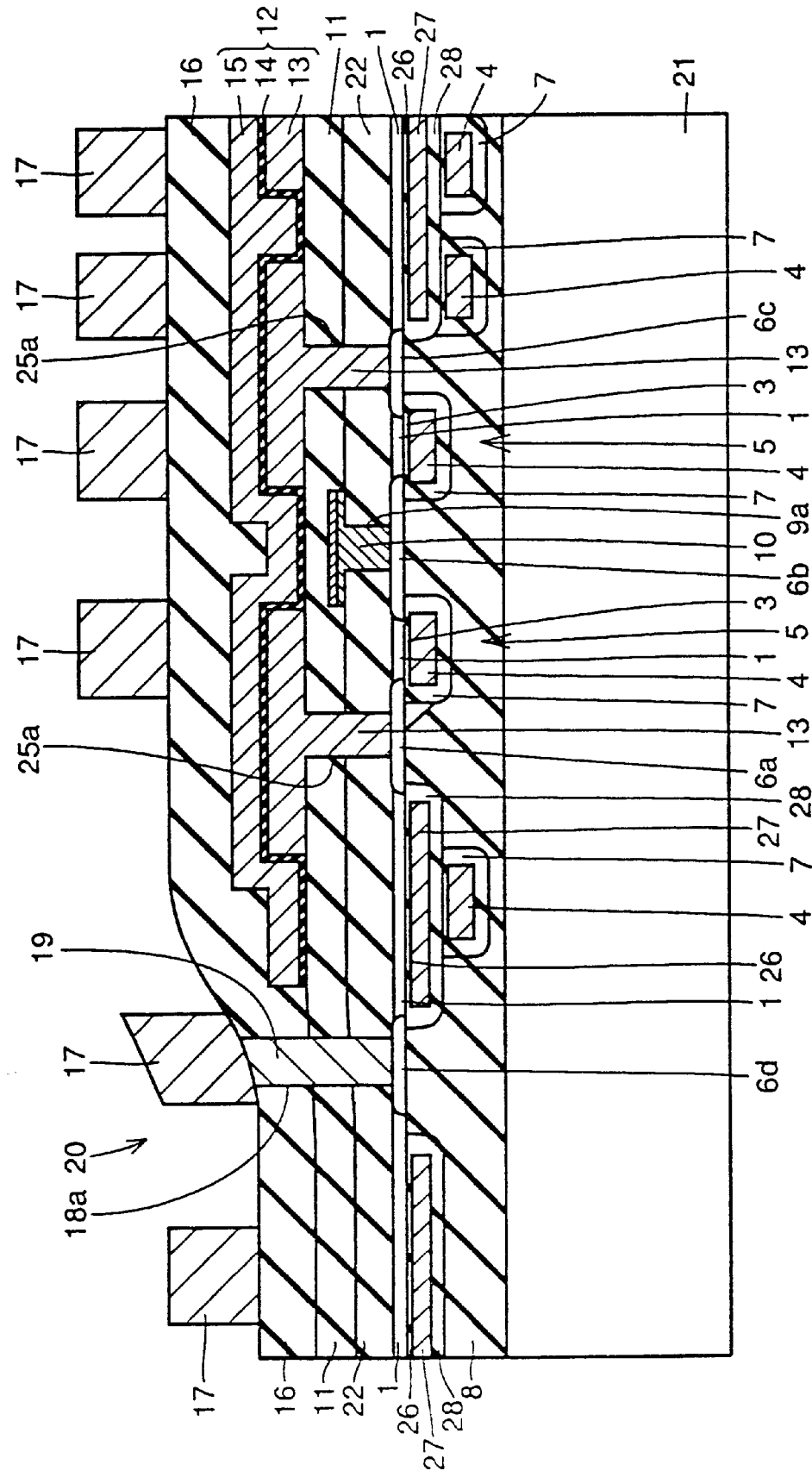
FIG. 20 is a cross section showing a DRAM of a third embodiment of the invention.

Referring to FIGS. 20 to 26, a third embodiment of the invention will be described below. FIG. 20 is a cross section showing a DRAM of the third embodiment of the invention. Referring to FIG. 20, this embodiment employs uses field shield isolation for isolating elements. Structures other than the above are the same as those in the first embodiment. Owing to the field shied isolation, it is possible to suppress the variation of the potential at the channel region of switch MOS transistor 5 similarly to the second embodiment. Thereby, reliability of the DRAM can be improved.

Referring to FIGS. 21 to 26, a method of manufacturing the DRAM of this embodiment will be described below. FIGS. 21 to 26 are cross sections showing 1st to 6th steps in a process of manufacturing the DRAM of this embodiment, respectively.

Figure 21:
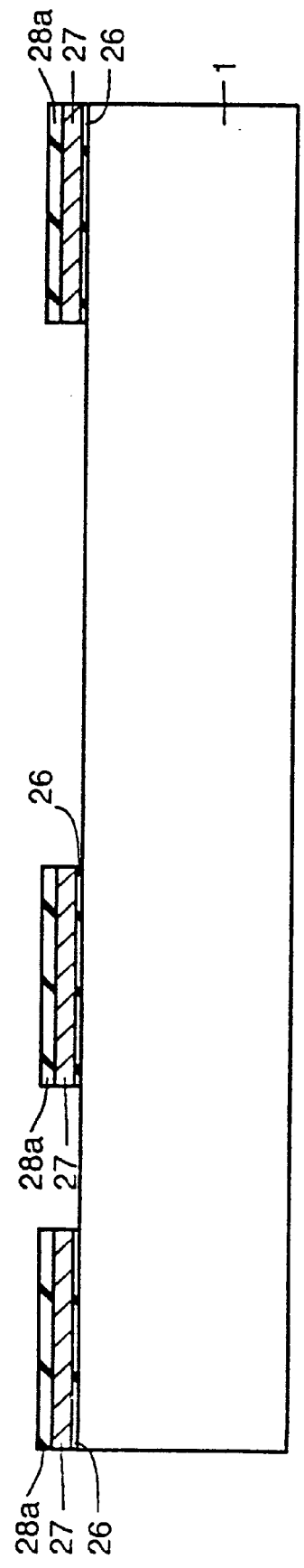
FIGS. 21 to 26 are cross sections showing 1st to 6th steps in a process of manufacturing the DRAM shown in FIG. 20, respectively.

Referring first to FIG. 21, a silicon oxide film is formed on the main surface of p-type silicon substrate 1 by thermal oxidation. A polycrystalline silicon layer is formed on this silicon oxide film by the CVD method. A silicon oxide film 28a is formed on this polycrystalline silicon layer by the CVD method. The silicon oxide films and polycrystalline silicon layer thus formed are patterned into a predetermined configuration. Thereby, gate oxide films 26 and field shield gates 27 are formed.

Figure 22:
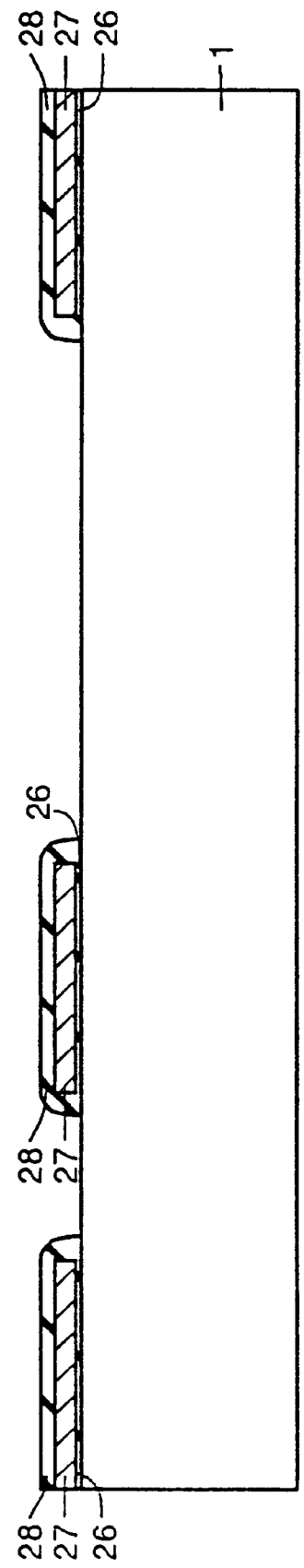
Figure 23:
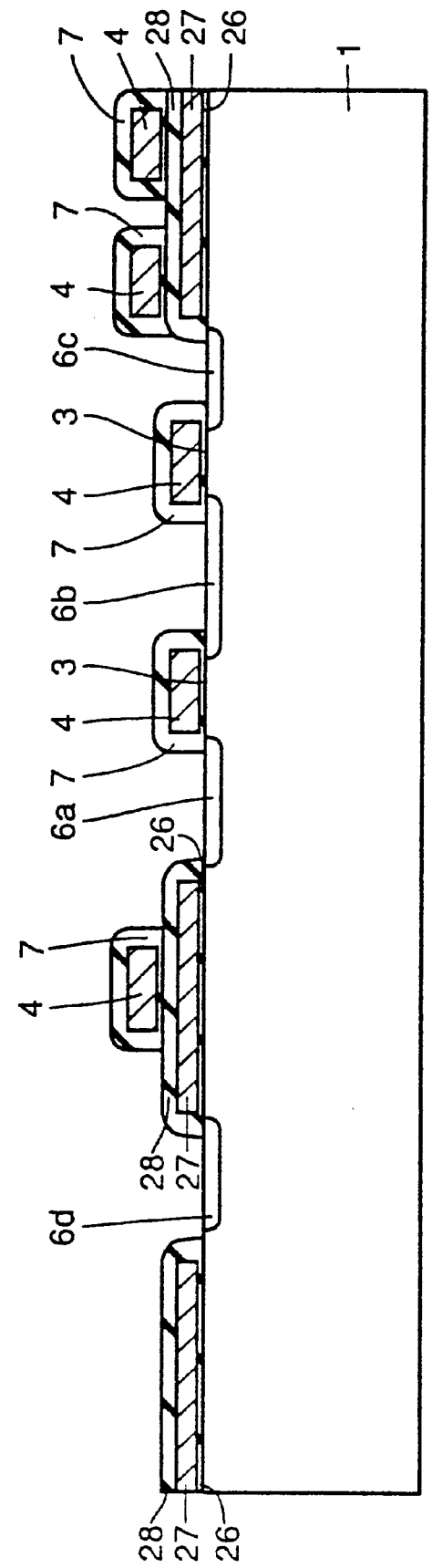

Referring to FIG. 22, the CVD method or the like is performed to deposit a silicon oxide film on the whole surface, and anisotropic etching is effected on the silicon oxide film. Thereby, silicon oxide films 28 covering field shied gates 27 are formed. Referring to FIG. 23, gate electrodes 4, oxide films 7 and n-type impurity diffusion layers 6a, 6b, 6c and 6d are formed by the steps similar to those of the first embodiment.

Figure 24:
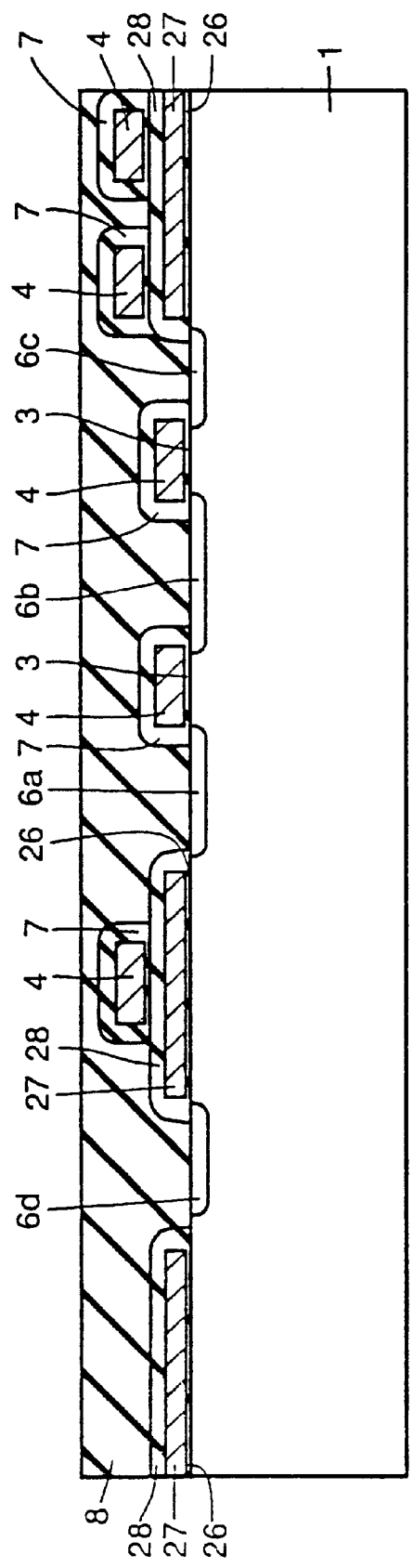
Figure 25:
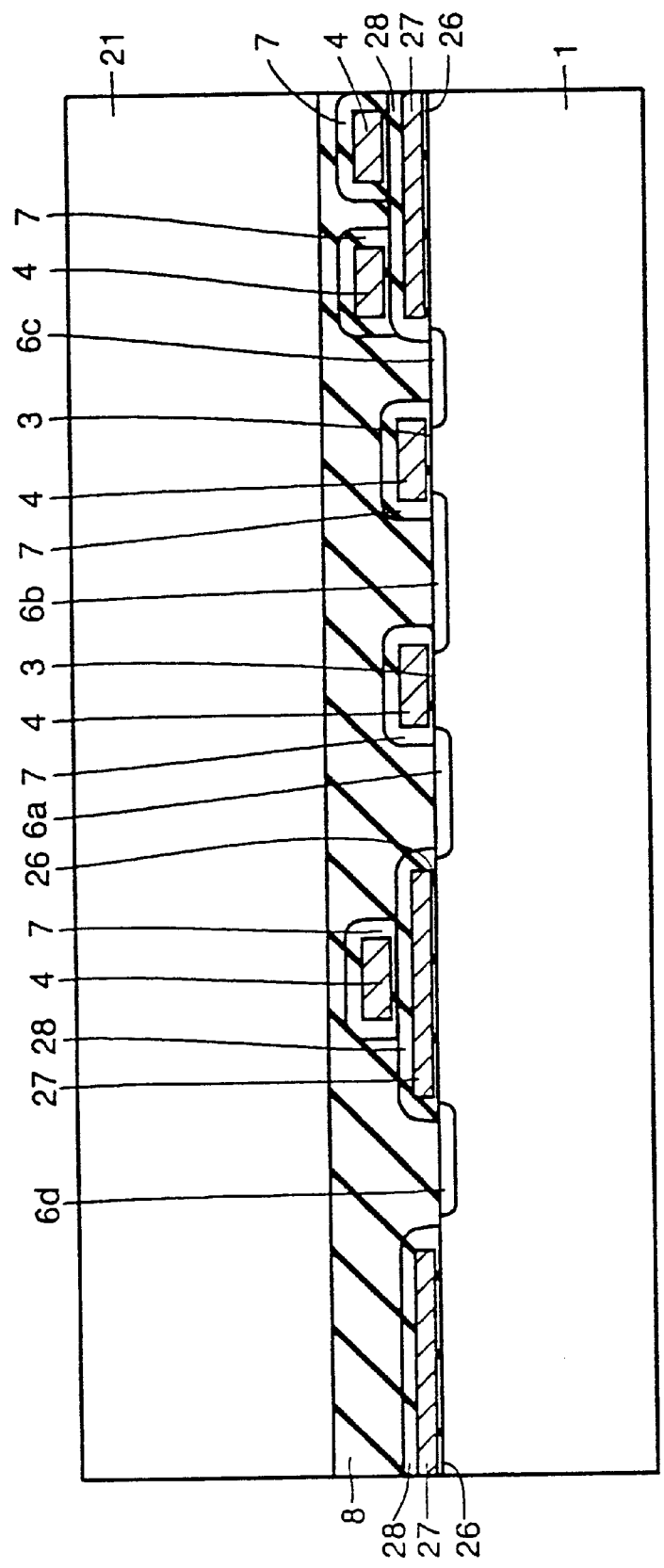
Figure 26:
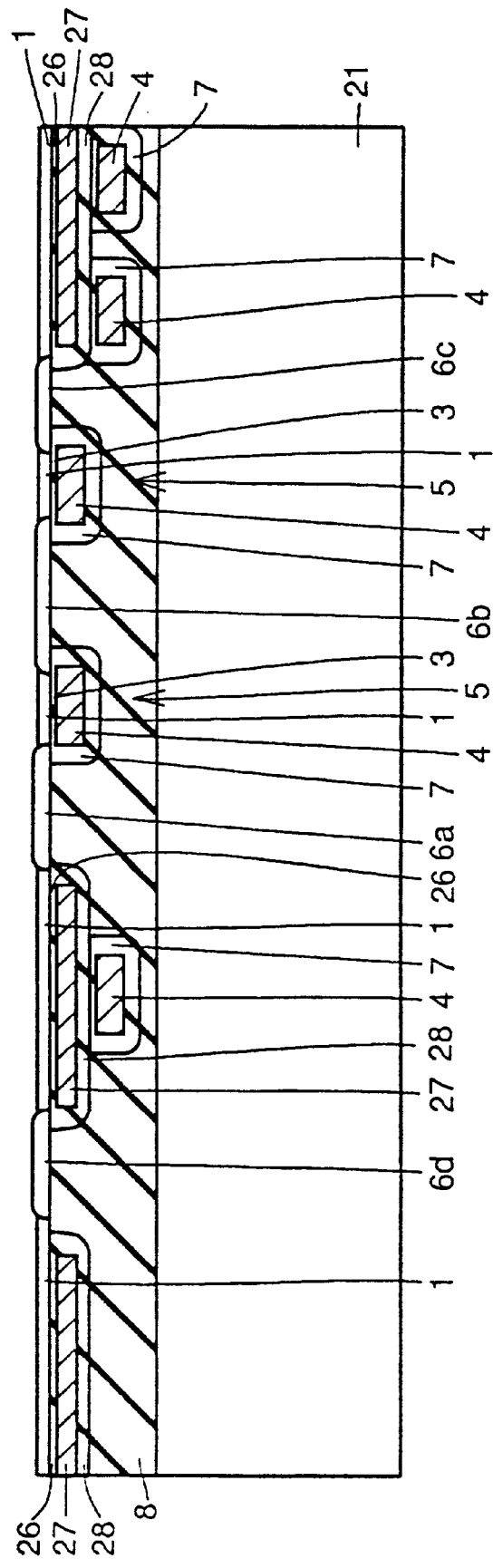

As shown in FIG. 24, first interlayer insulating layer 8 is formed by the steps similar to those of the first embodiment. As shown in FIG. 25, substrate 21 is joined to the upper surface of interlayer insulating layer 8 by the steps similar to those of the first embodiment. As shown in FIG. 26, the thickness of silicon substrate 1 is reduced to form semiconductor layer 1 by the steps similar to those of the first embodiment. Thereafter, steps similar to those of the first embodiment are performed to form the DRAM shown in FIG. 20.

(Fourth Embodiment)

Figure 27:
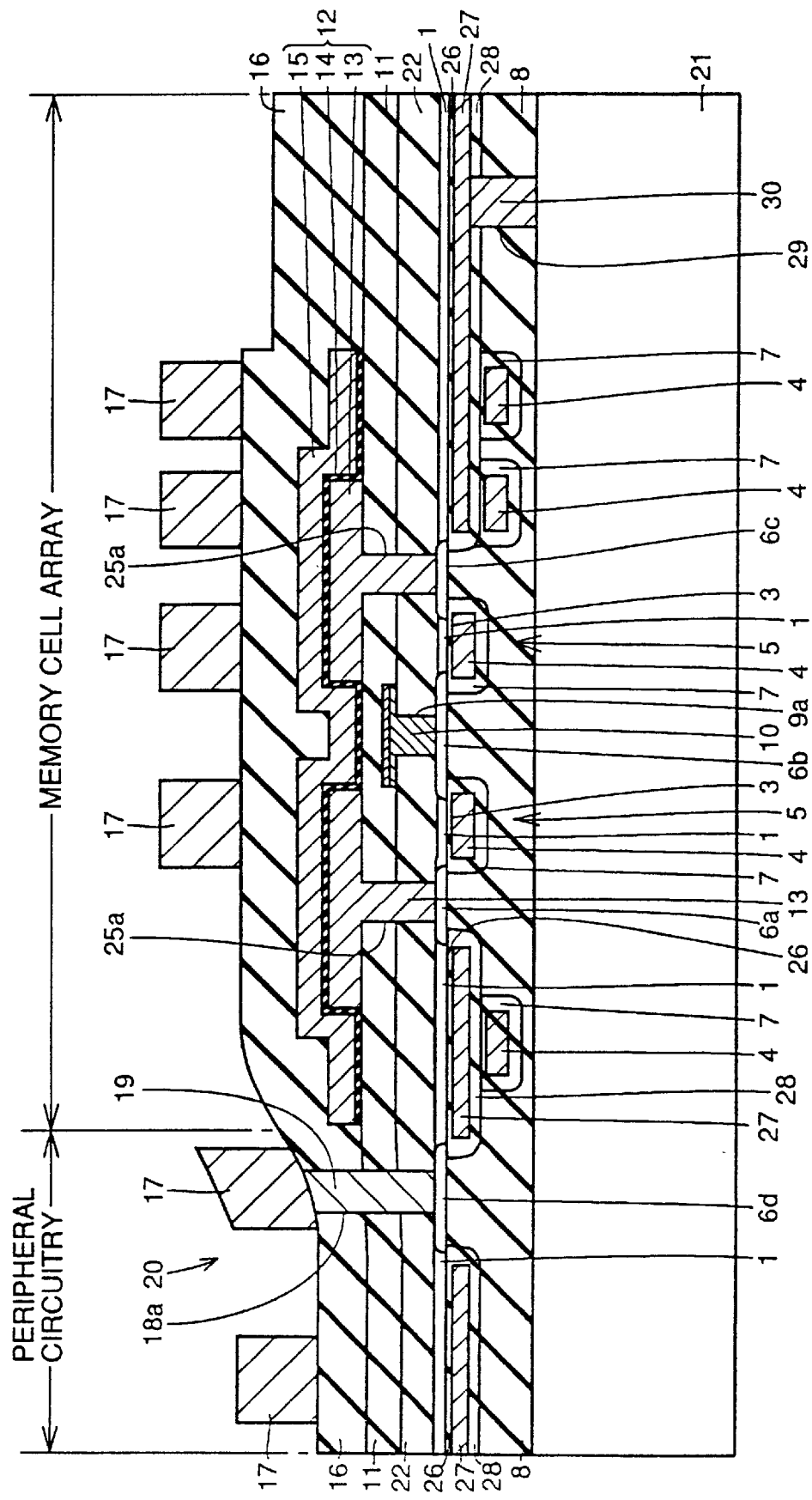
FIG. 27 is a cross section showing a DRAM of a fourth embodiment of the invention.

Referring to FIGS. 27 to 34, a fourth embodiment of the invention will be described below. FIG. 27 is a cross section showing a DRAM of the fourth embodiment of the invention.

In this embodiment, as shown in FIG. 27, field shield gate 27 is electrically connected to substrate 21 via a plug electrode 30. Structures other than this are the substantially same as those of the third embodiment.

Owing to electrical connection between the field shield gate 27 and substrate 21, it is possible to stabilize the potential of field shied gate 27. Thereby, element isolating characteristics can be improved.

The plug electrode 30 may be made of polycrystalline silicon or high melting point metal such as tungsten (W) or titanium (Ti). If plug electrode 30 is made of the high melting point metal, a silicide layer may be formed at a boundary between substrate (silicon substrate) 21 and plug electrode 30 in a thermal processing step after formation of plug electrode 30. In this case, a contact resistance between plug electrode 30 and substrate 21 can be reduced, and the DRAM can have a high performance.

Referring to FIGS. 28 to 34, a method of manufacturing the DRAM of this embodiment will be described below. FIGS. 28 to 34 are cross sections showing 1st to 7th steps in a process of manufacturing the DRAM of the fourth embodiment of the invention, respectively.

Figure 28:
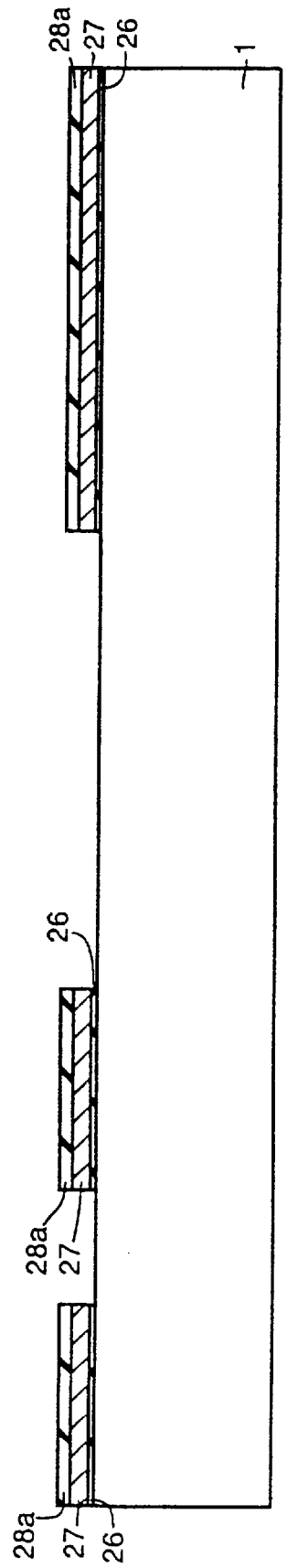
FIGS. 28 to 34 are cross sections showing 1st to 7th steps in a process of manufacturing the DRAM shown in FIG. 27, respectively.
Figure 29:
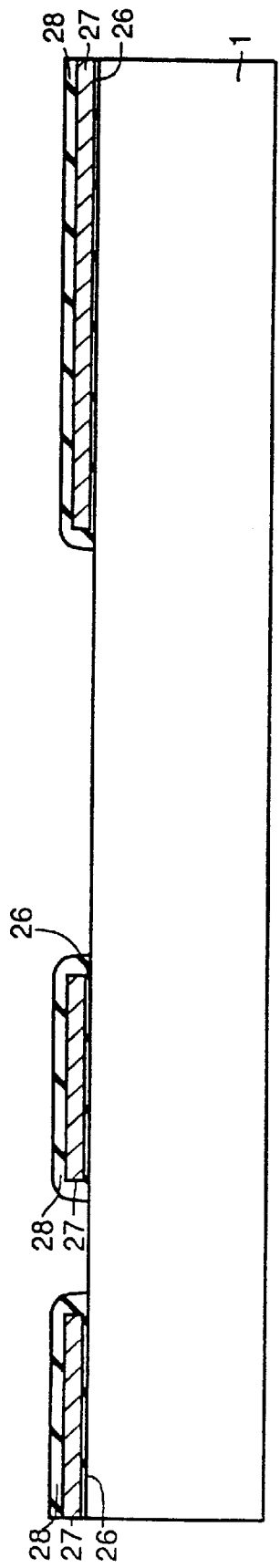

Referring to FIG. 28, steps similar to those of the third embodiment already described are performed to form gate oxide films 26, field shield gates 27 and oxide films 28a. As shown in FIG. 29, oxide films 28 covering field shield gates 27 are formed by the steps similar to those of the third embodiment.

Figure 30:
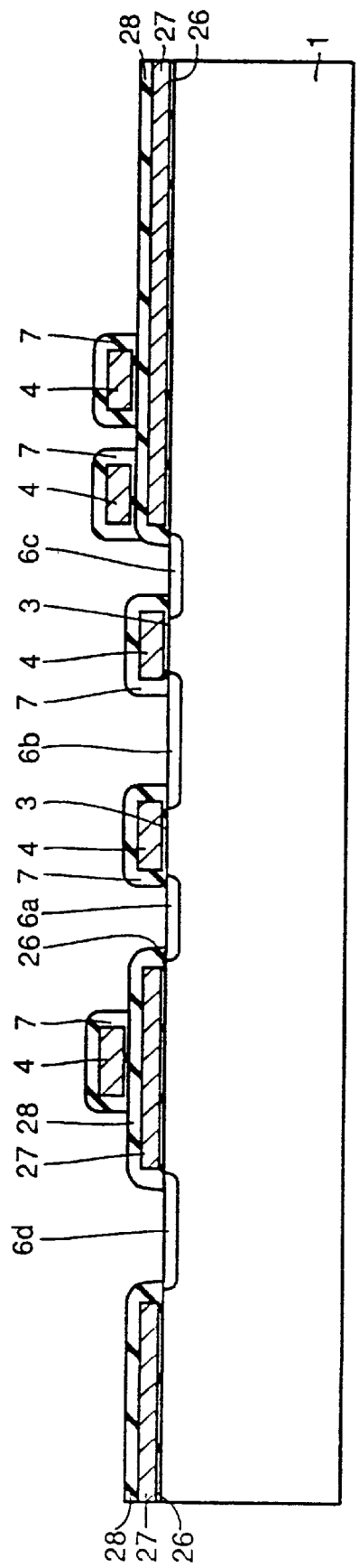
Figure 31:
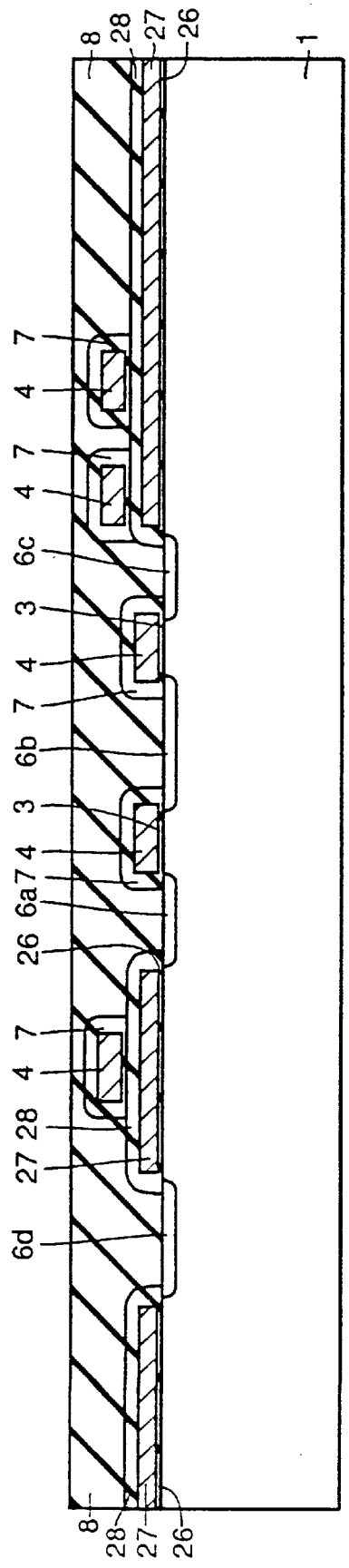

Referring to FIGS. 30 and 31, gate electrodes 4, oxide films 7, n-type impurity diffusion layers 6a, 6b, 6c and 6d, and first interlayer insulating layer 8 are formed by the steps similar to those of the first embodiment.

Figure 32:
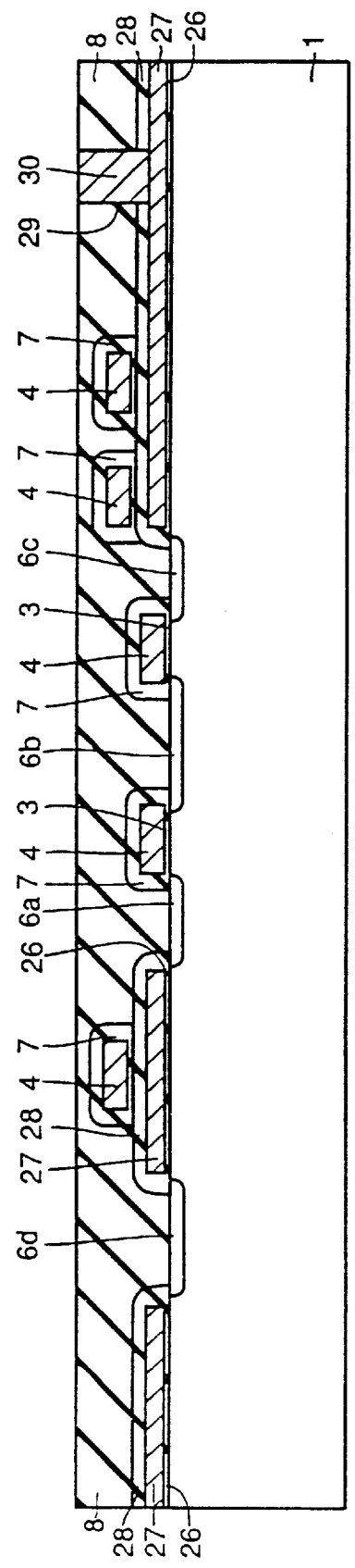

Referring to FIG. 32, a contact hole 29 reaching field shield gate 27 is formed at first interlayer insulating layer 8. The CVD method or the like is performed to form a polycrystalline silicon layer or a high melting point metal layer on the upper surface of first interlayer insulating layer 8 and in contact hole 29. Etchback is effected on the polycrystalline silicon layer or high melting point metal layer to form plug electrode 30 in contact hole 29.

Figure 33:
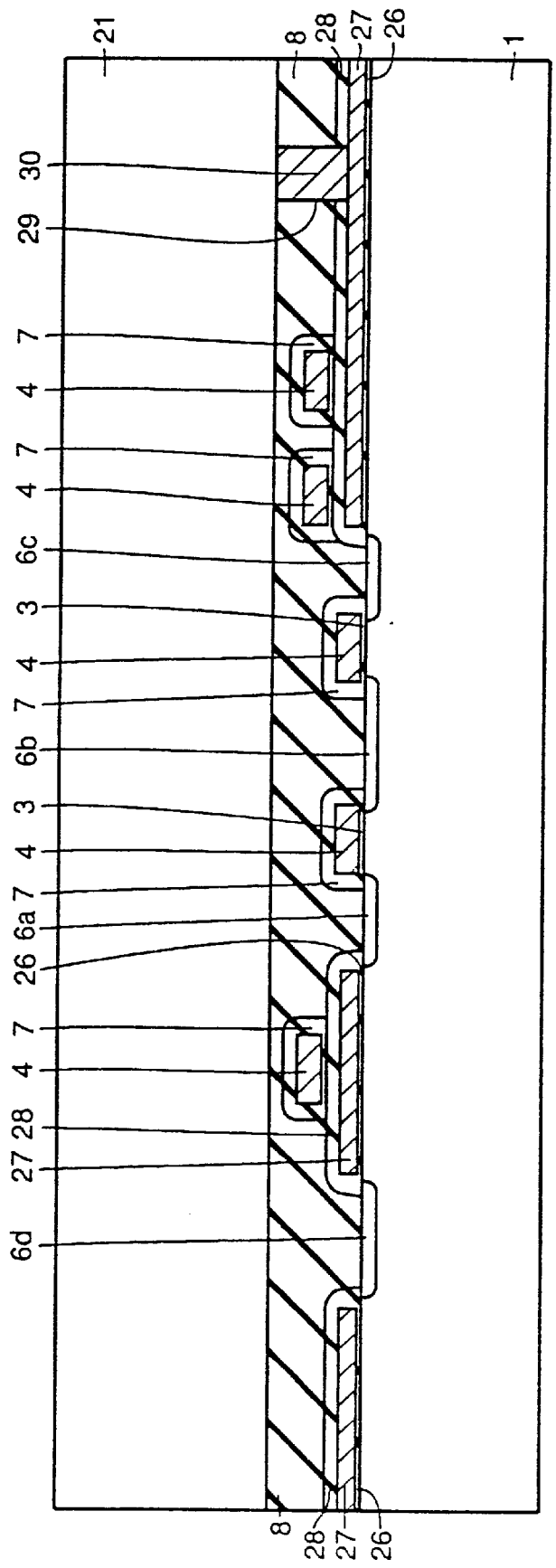
Figure 34:
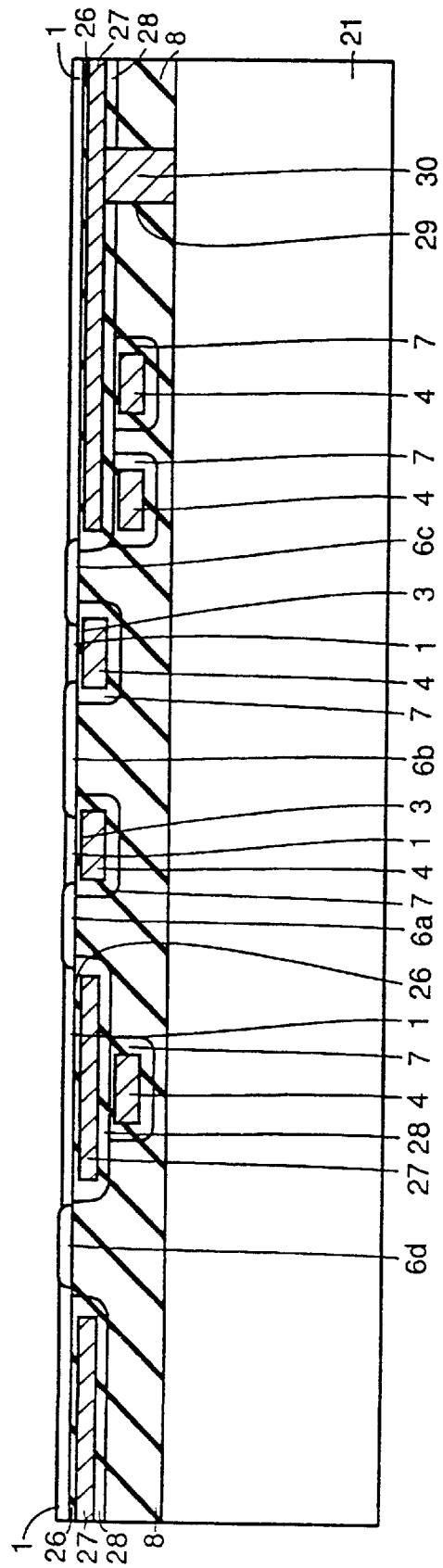

Referring to FIG. 33, substrate 21 is joined to the upper surface of first interlayer insulating layer 8 by the steps similar to those of the first embodiment. At the same time, plug electrode 30 is joined to substrate 21. As shown in FIG. 34, the thickness of silicon substrate 1 is reduced by the steps similar to those of the first embodiment, so that semiconductor layer 1 is formed. Thereafter, steps similar to those of the first embodiment are performed to complete the DRAM shown in FIG. 27.

(Fifth Embodiment)

Figure 35:
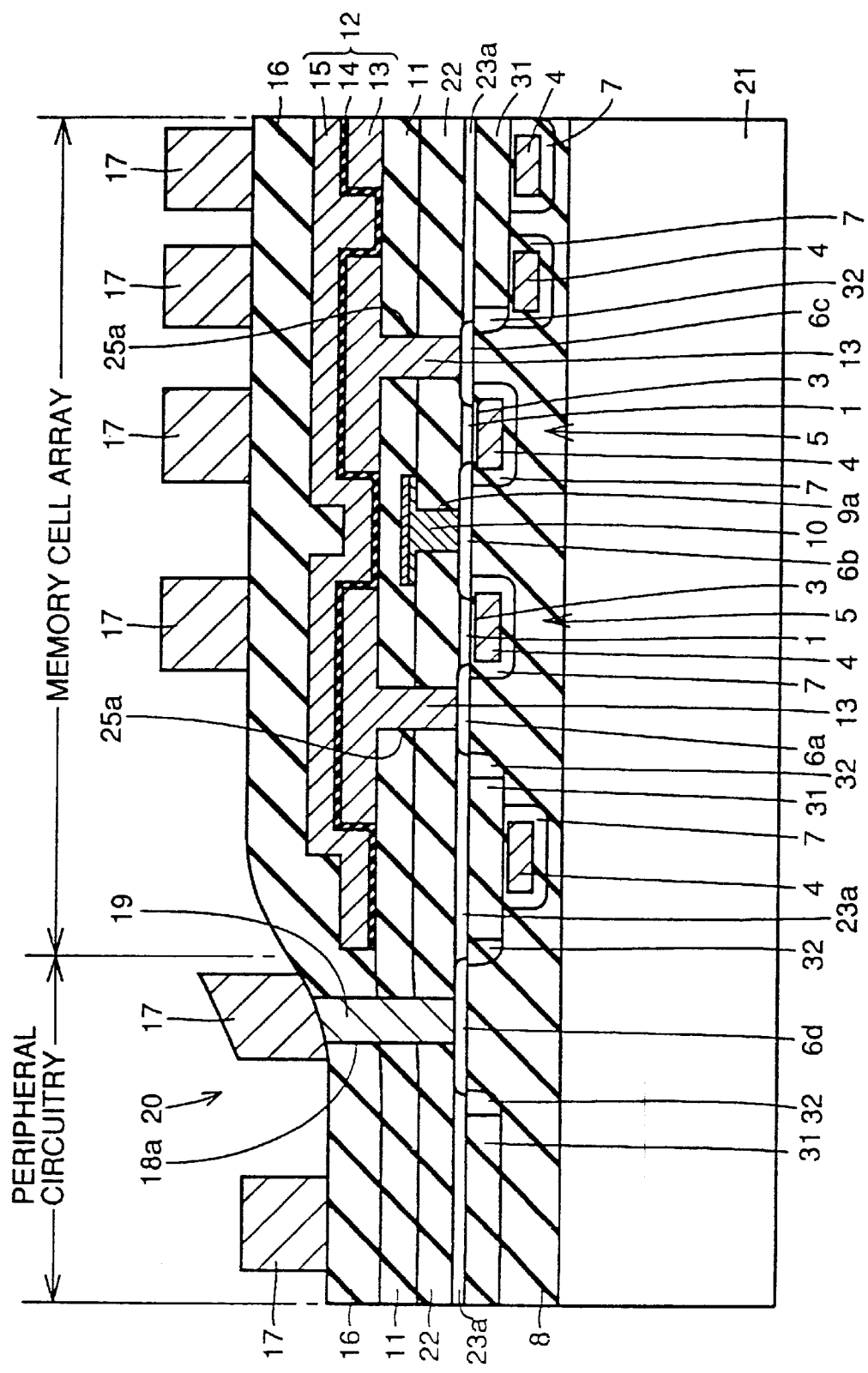
FIG. 35 is a cross section showing a DRAM of a fifth embodiment of the invention.

Referring to FIGS. 35 to 41, a fifth embodiment of the invention will be described below. FIG. 35 is a cross section showing a fifth embodiment of the invention.

Referring to FIG. 35, this embodiment includes p-type impurity diffusion layers 23a formed at element isolating regions in semiconductor layer 1 for isolating elements. Insulating layers 31 made of silicon oxide films and side wall spacers 32 made of silicon oxide films are formed under impurity diffusion layers 23a. Structures other than the above are the same as those of the DRAM of the first embodiment shown in FIG. 1. Also in this embodiment, it is possible to suppress the variation of potential at the channel region of switch MOS transistors 5.

Referring to FIGS. 36 to 41, a method of manufacturing the DRAM of this embodiment will be described below. FIGS. 36 to 41 are cross sections showing 1st to 6th steps in a process of manufacturing the DRAM of this embodiment, respectively.

Figure 36:
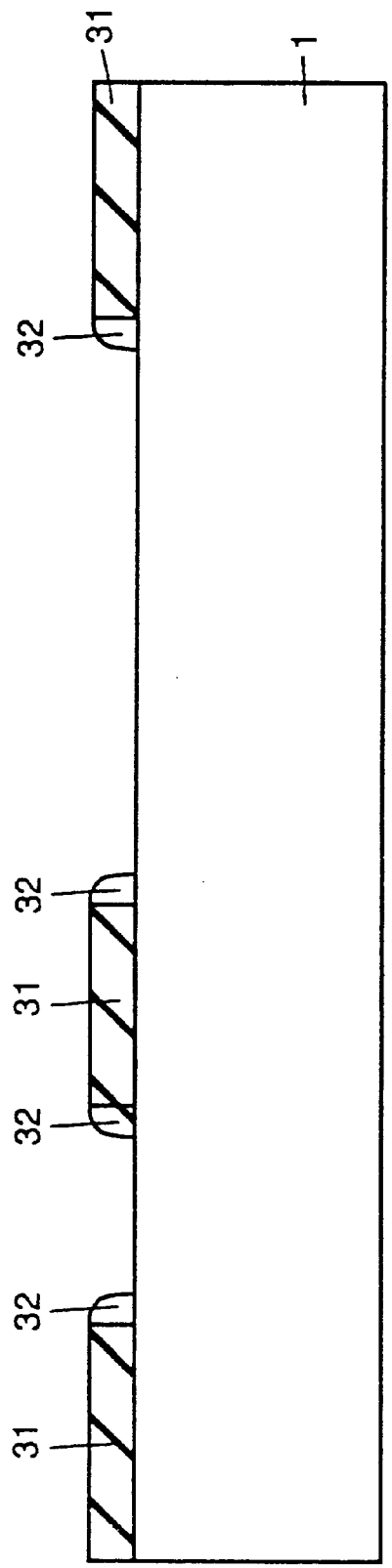
FIGS. 36 to 41 are cross sections showing 1st to 6th steps in a process of manufacturing the DRAM shown in FIG. 35, respectively.

Referring first to FIG. 36, the CVD method or the like is performed to form insulating layer 31 made of, e.g., a silicon oxide film on the main surface of p-type silicon substrate 1. The insulating layer 31 is patterned into a predetermined configuration. Thereafter, the CVD method is performed again to form a silicon oxide film on the whole main surface of p-type silicon substrate 1. Etchback is effected on the silicon oxide film. Thereby, side wall spacers 32 are formed on the side walls of insulating layers 31.

Figure 37:
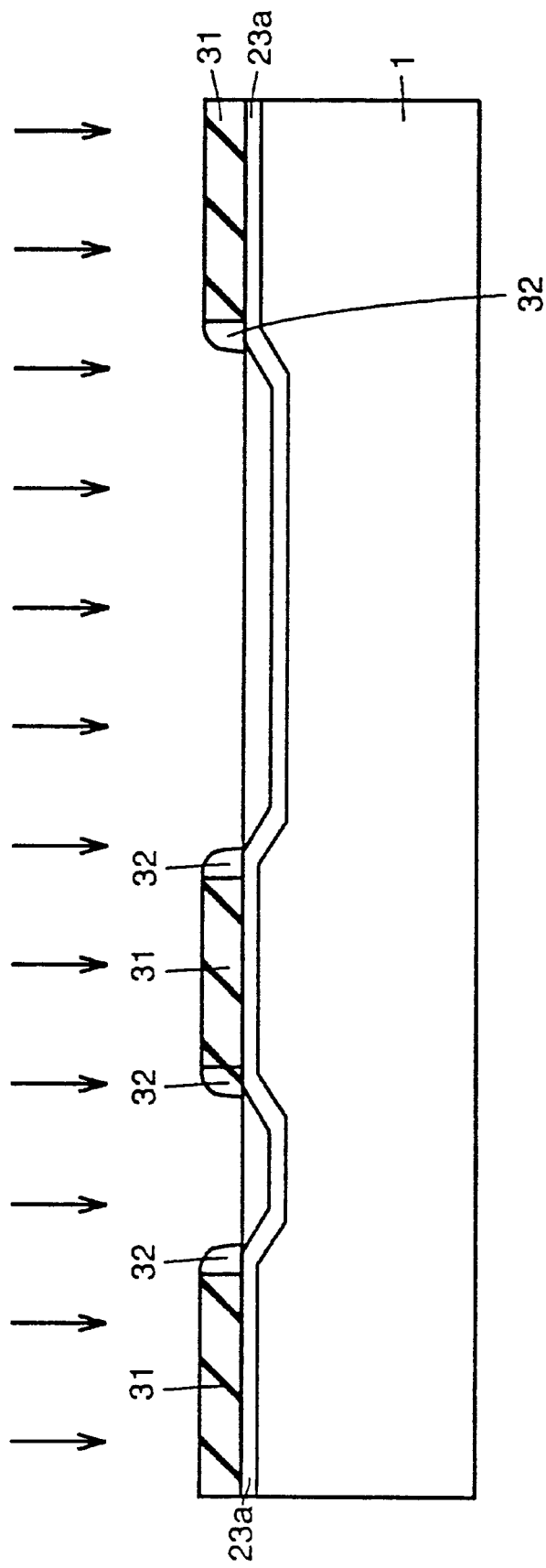

Referring to FIG. 37, p-type impurity is implanted into the main surface of p-type silicon substrate 1 with an energy allowing the impurity to penetrate the insulating layers 31 and side wall spacers 32. Thereby, p-type impurity diffusion layer 23a for element isolation is formed.

Figure 38:
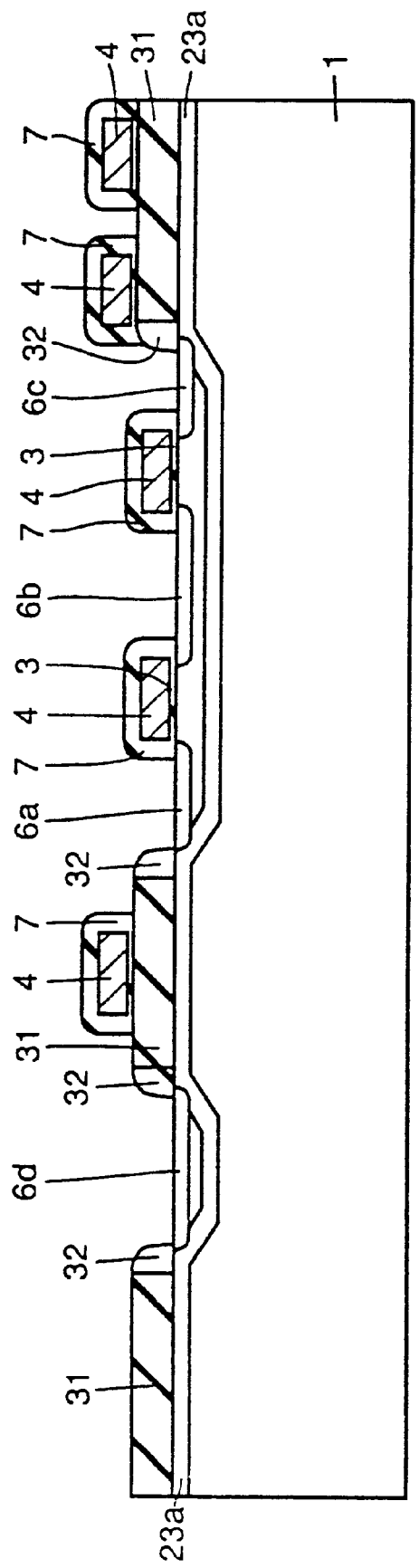
Figure 39:
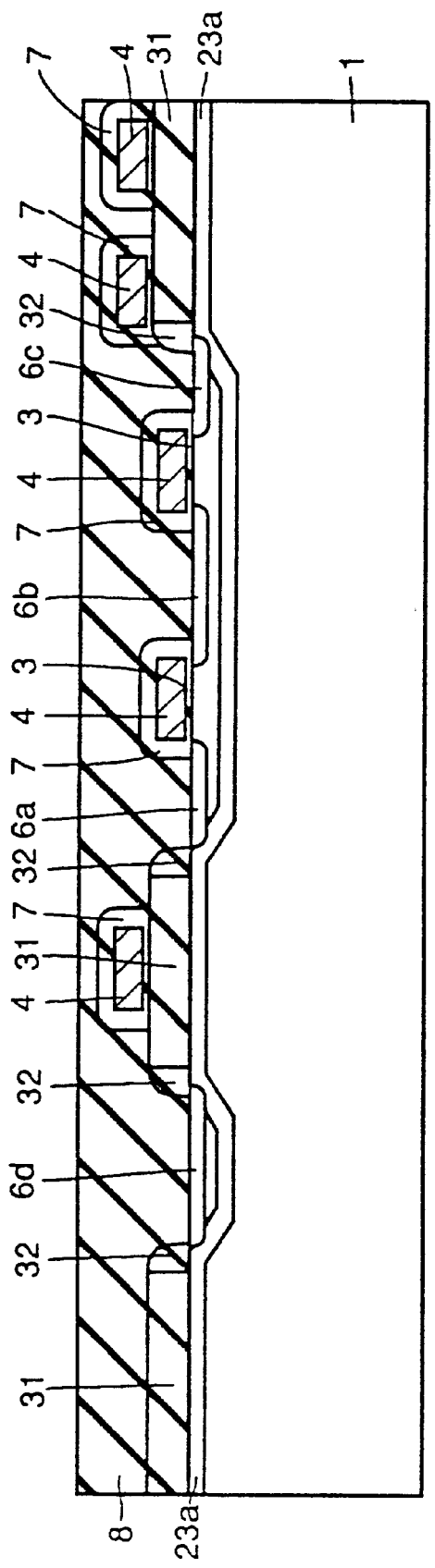

Referring to FIGS. 38 and 39, gate electrodes 4, n-type impurity diffusion layers 6a, 6b, 6c and 6d, oxide films 7 and first interlayer insulating layer 8 are formed by the steps similar to those of the first embodiment.

Figure 40:
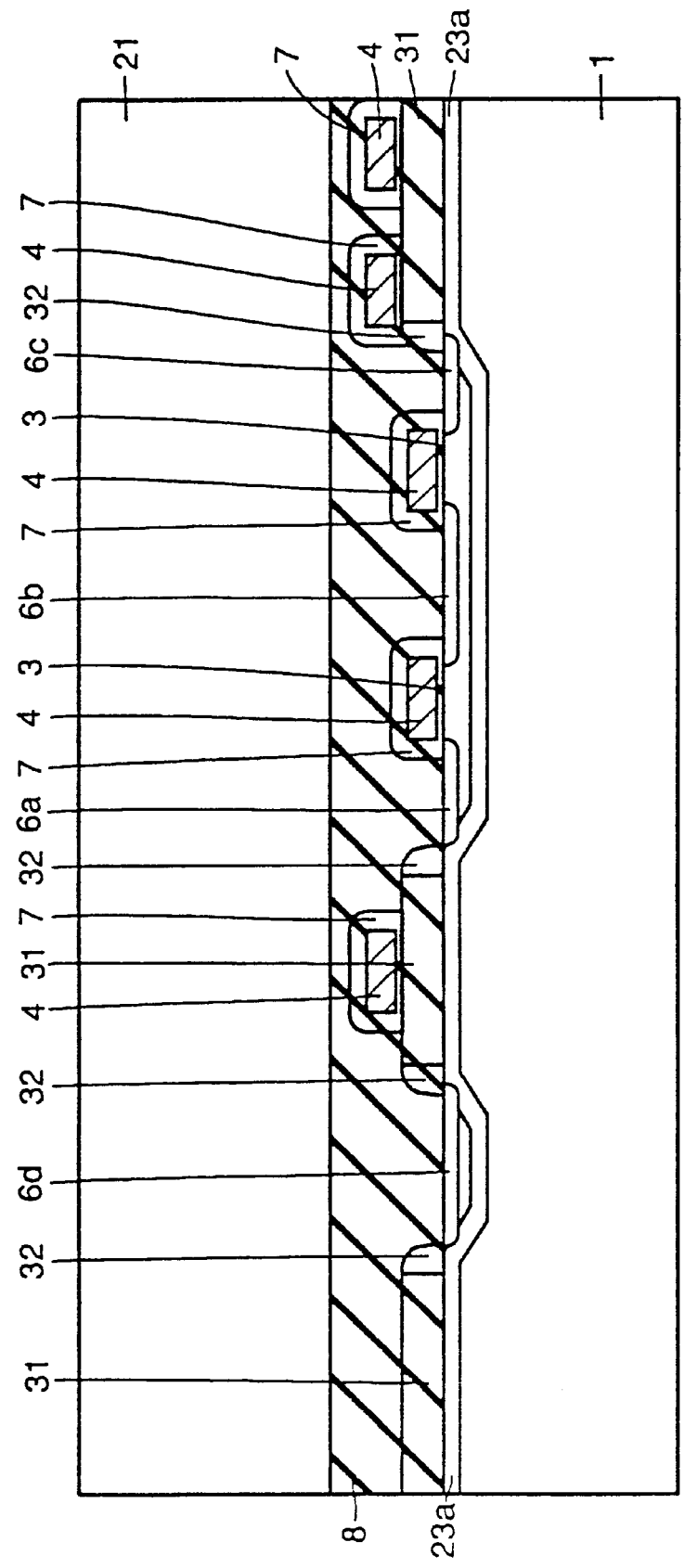
Figure 41:
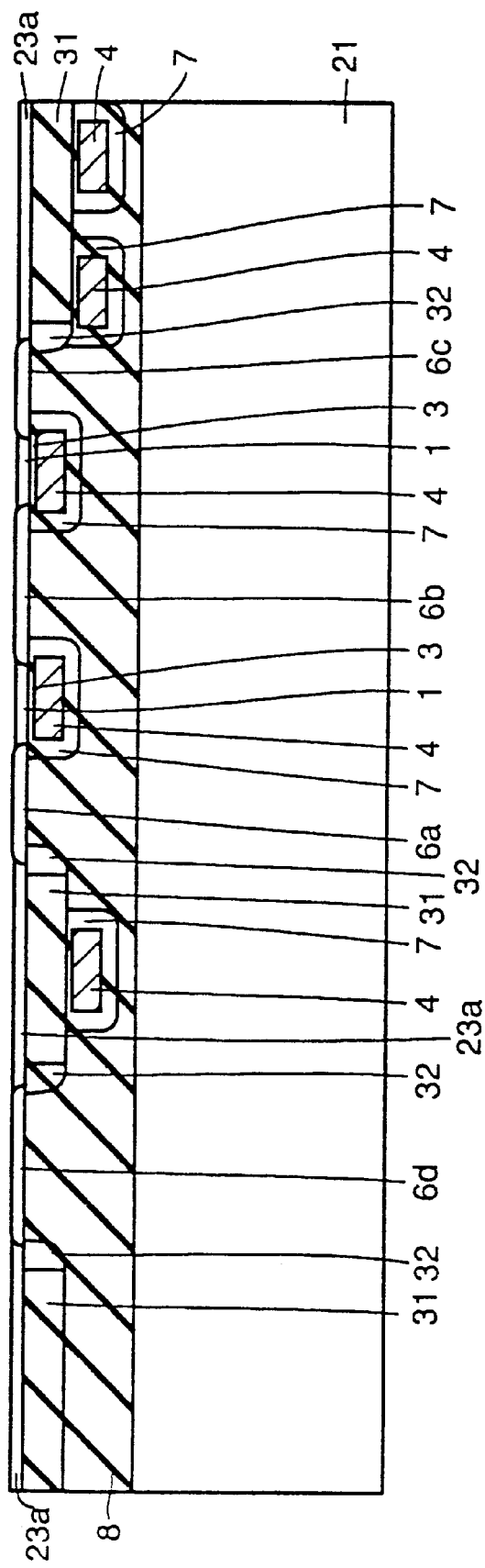

Referring to FIGS. 40 and 41, substrate 21 is joined to the upper surface of first interlayer insulating layer 8 by the steps similar to those of the first embodiment. As shown in FIG. 41, the thickness of silicon substrate 1 is reduced by the processing effected on its rear surface, so that semiconductor layer 1 is formed. Thereafter, steps similar to those of the first embodiment are performed to complete the DRAM shown in FIG. 35.

(Sixth Embodiment)

Figure 42:
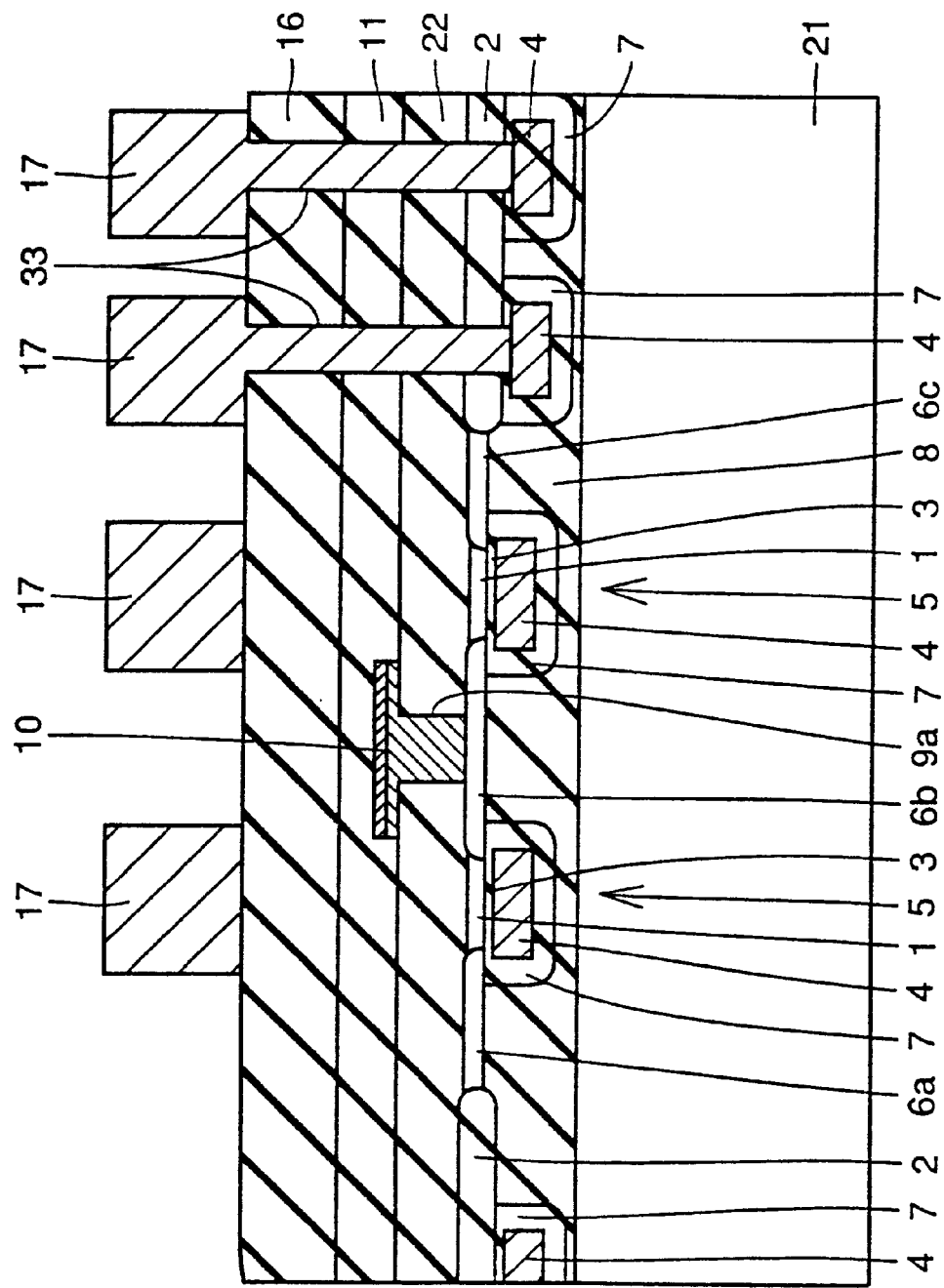
FIG. 42 is a cross section showing a DRAM of a sixth embodiment of the invention.
Figure 43:
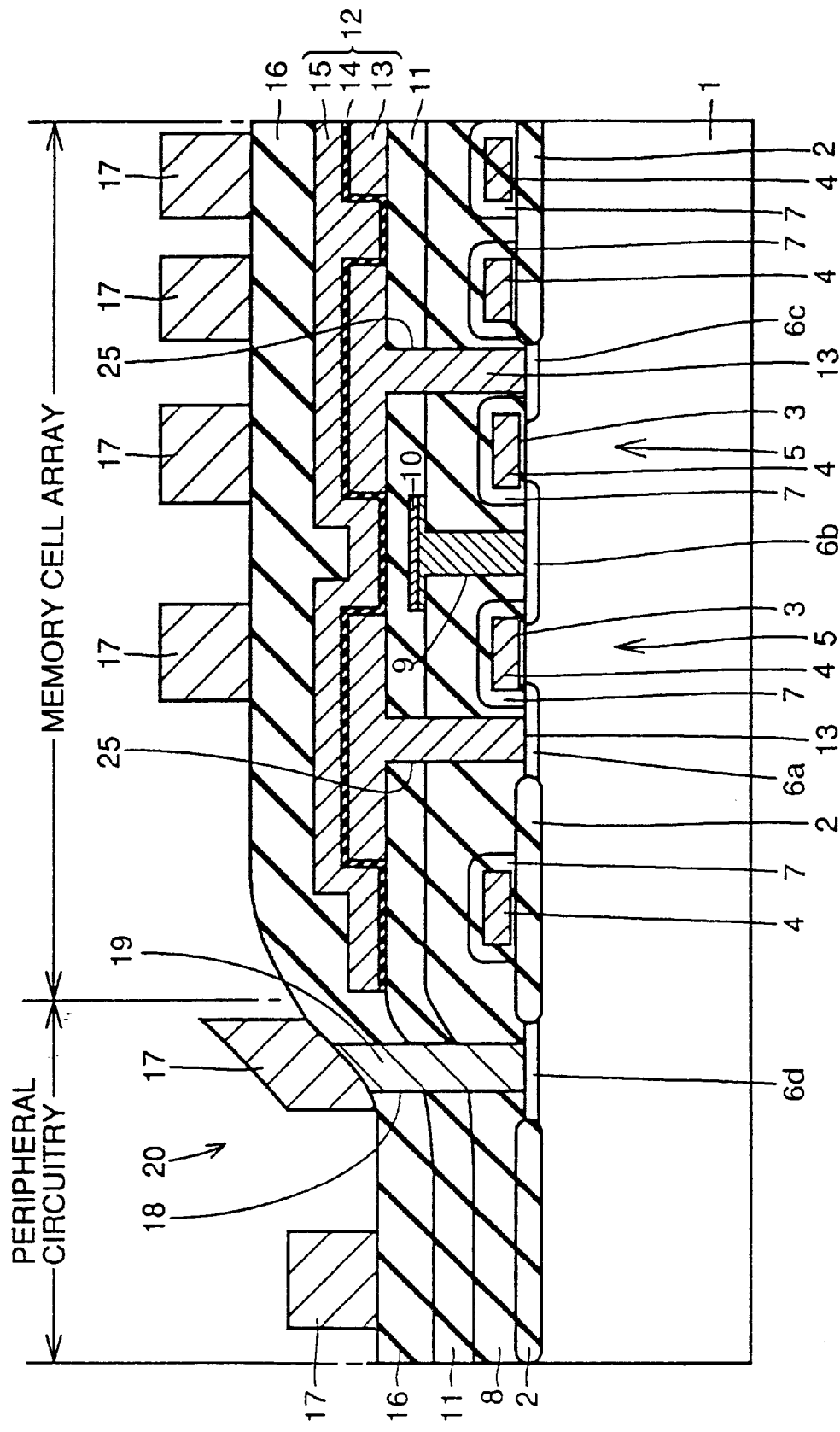
FIG. 43 is a cross section showing a conventional DRAM.
Figure 44:
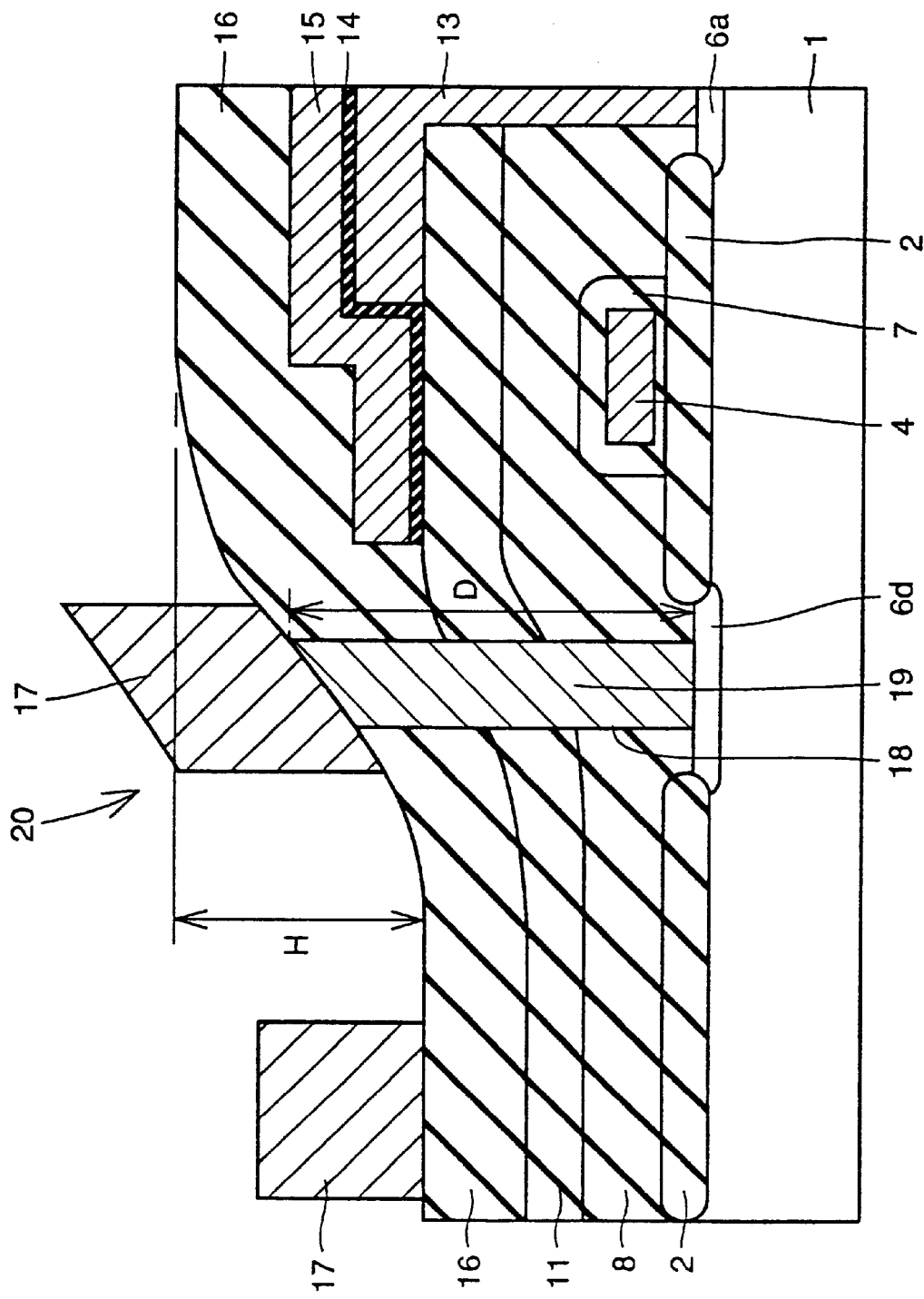
FIG. 44 is a cross section showing, on an enlarged scale, a boundary portion between a memory cell array and a peripheral circuitry of the conventional DRAM shown in FIG. 43.

Referring to FIG. 42, a sixth embodiment of the invention will be described below. FIG. 42 is a cross section showing a DRAM of the sixth embodiment of the invention.

Referring to FIG. 42, the memory cell array of the DRAM is provided with a plurality of capacitors 12. At positions between these capacitors, there are formed contact holes 33 which penetrate element isolating oxide film 2, interlayer insulating layer 22, second interlayer insulating layer 11 and third interlayer insulating layer 16, and reach word line 4. Interconnection layer 17 is formed in each contact hole 33. Interconnection layer 17 is electrically connected to word line 4. Thereby, the resistance of word line 4 can be reduced.

Structures other than the above are the same as those in the first embodiment shown in FIG. 1.

According to the invention, as described above, it is possible to reduce a level difference between the memory cell array and the peripheral circuitry. Thereby, failure in patterning of the interconnection layers can be effectively prevented even in the structure having the interconnection layer formed at the peripheral circuitry adjacent to the memory cell array. Accordingly, the semiconductor memory device can have high reliability.

Further, the gate electrode of the switch MOS transistor is formed under the semiconductor layer, and the bit line is formed above the semiconductor layer, so that it is possible to reduce the thickness of the insulating layer provided for isolating the bit line and the semiconductor layer from each other. Therefore, it is possible to reduce the depths of contact holes for connecting the bit line and one of the impurity diffusion layers of the switch MOS transistor, connecting the lower electrode of the capacitor and the other of the impurity diffusion layers of the switch MOS transistor and connecting the impurity diffusion layer and the interconnection layer in the peripheral circuitry, as compared with the prior art. Consequently, each contact hole can be formed easily. In the structure where the plug electrode is formed in the contact hole, it is possible to suppress effectively generation of a void in the plug electrode. Accordingly, the reliability of the semiconductor memory device can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor memory device including a memory cell array provided with a memory cell having a switch MOS transistor and a charge storing capacitor, and a peripheral circuitry provided with a peripheral circuit for controlling operation of said memory cell, comprising the steps of:

forming an element isolating region on a main surface of a first substrate having the main surface and a rear surface opposed to each other;

forming a switch MOS transistor on the main surface of said first substrate located in said memory cell array;

forming a first interlayer insulating layer on the main surface of said first substrate, said first interlayer insulating layer covering said switch MOS transistor and said element isolating region, and extending from said memory cell array into said peripheral circuitry;

flattening an upper surface of said first interlayer insulating layer;

joining the upper surface of said first interlayer insulating layer to a second substrate;

effecting processing on a rear surface of said first substrate to reduce a thickness of said first substrate for forming a semiconductor layer in said memory cell array and said peripheral circuitry;

forming a bit line and a charge storing capacitor on a surface of said semiconductor layer located in said memory cell array; and forming a second interlayer insulating layer covering said bit line, said capacitor and said semiconductor layer, and extending from said memory cell array into said peripheral circuitry.

2. The method of manufacturing the semiconductor memory device according to claim 1, wherein said step of forming said semiconductor layer includes the step of polishing the rear surface of said first substrate to reduce the thickness of said first substrate and flatten the surface of said semiconductor layer.

3. The method of manufacturing the semiconductor memory device according to claim 1, wherein said step of forming said element isolating region includes the step of, selectively forming an element isolating oxide film on the main surface of said first substrate by an LOCOS (Local Oxidation of Silicon) method; and said step of forming said semiconductor layer includes the step of, reducing the thickness of said first substrate to expose said element isolating oxide film.

4. The method of manufacturing the semiconductor memory device according to claim 1, wherein said step of forming said element isolating region includes the steps of, selectively forming an element isolating oxide film on the main surface of said first substrate by an LOCOS (Local Oxidation of Silicon) method, and forming an impurity diffusion layer for element isolation by implanting predetermined impurity into the main surface of said first substrate through said element isolating oxide film; and said step of forming said semiconductor layer includes the step of, reducing the thickness of said first substrate to expose a surface of said impurity diffusion layer.

5. The method of manufacturing the semiconductor memory device according to claim 1, wherein said step of forming said element isolating region includes the steps of, forming a field shield gate at a predetermined position on the main surface of said first substrate with a gate insulating layer, and forming an insulating layer covering said field shield gate; and said step of forming said semiconductor layer includes the step of reducing a thickness of said first substrate while leaving said semiconductor layer of a predetermined thickness on said field shield gate.

6. The method of manufacturing the semiconductor memory device according to claim 5, wherein said step of flattening the upper surface of said first interlayer insulating layer includes the steps of, forming a contact hole penetrating said first interlayer insulating layer and reaching said field shield gate, and forming a plug electrode in said contact hole; and said step of joining the upper surface of said first interlayer insulating layer to said second substrate includes the step of joining said plug electrode to said second substrate at the same time.

7. The method of manufacturing the semiconductor memory device according to claim 1, wherein said step of forming said element isolating region includes the steps of, forming an insulating layer for element isolation on the main surface of said first substrate, and forming an impurity diffusion layer for element isolation by implanting predetermined impurity into said first substrate through said insulating layer for element isolation; and said step of forming said semiconductor layer includes the step of reducing a thickness of said first substrate to expose a surface of said impurity diffusion layer.

* * * * *